United States Patent
Asano et al.

[11] Patent Number: 5,875,049
[45] Date of Patent: Feb. 23, 1999

[54] AMPLIFIER FOR BURST SIGNAL AND OPTICAL RECEIVING CIRCUIT

[75] Inventors: Hiroaki Asano, Katano; Hiroaki Yamamoto; Katsuyuki Fujito, both of Higashiosaka, all of Japan

[73] Assignee: Matsushita Electric Industrial Co., Ltd., Osaka-fu, Japan

[21] Appl. No.: 803,927

[22] Filed: Feb. 24, 1997

[30] Foreign Application Priority Data

Feb. 23, 1996 [JP] Japan ..................... 8-035876

[51] Int. Cl.[6] .................................. H04B 10/06
[52] U.S. Cl. .................. 359/189; 330/59; 250/214 A
[58] Field of Search ............... 359/189; 330/59, 330/252, 308; 250/214 A

[56] References Cited

U.S. PATENT DOCUMENTS

| | | | |
|---|---|---|---|
| 5,025,176 | 6/1991 | Takeno | 307/351 |
| 5,307,196 | 4/1994 | Kinoshita | 359/189 |
| 5,430,766 | 7/1995 | Ota et al. | 375/318 |
| 5,612,810 | 3/1997 | Inami et al. | 359/189 |

FOREIGN PATENT DOCUMENTS

| | | |
|---|---|---|
| 0 489 927 | 6/1992 | European Pat. Off. . |
| 0 597 633 | 5/1994 | European Pat. Off. . |
| 0 621 686 | 10/1994 | European Pat. Off. . |
| 29 05 904 | 8/1980 | Germany . |
| 6-310967 | 11/1994 | Japan . |
| 8-84160 | 3/1996 | Japan . |
| 7-107943 | 11/1996 | Japan . |

OTHER PUBLICATIONS

M. Soda, et al., One–chip Receiver IC for 2.4 Gb/s Optical Communication Systems, Jan. 5, 1995, pp. 99–102, IEEE 1995 Custom Integrated Circuits Conference.

Makoto Nakamura, et al., A Wide–Dynamic–Range and Extremely High–sensitivity CMOS Optical Receiver IC using Feed–Forward Auto–Bias Adjustment, Jan. 5, 1994, pp. 629–632, IEEE 1994 Custom Integrated Circuits Conference.

Primary Examiner—Kinfe-Michael Negash
Attorney, Agent, or Firm—Wenderoth, Lind & Ponack, L.L.P.

[57] ABSTRACT

The present invention provides an amplifier capable of accurately reproducing a signal under various operating environments and an optical receiving circuit using the amplifier. The differential amplifier is constructed such that the amplification factor thereof is set to 0.5, and a variation occurring inside thereof is the same as a variation occurring inside of the differential amplifier. Respective output variations occurring in maximum value holding circuits due to a temperature variation and a power supply voltage variation are canceled by providing differential amplification in the differential amplifier. At this time, an output variation occurring in the differential amplifier is also canceled. Therefore, an output variation occurring in the differential amplifier is made equal in value to the output variation occurring in the differential amplifier, such that the same variation as a signal input is superimposed on the reference input fed to the differential amplifier. consequently, a reference input accurately following the DC level of the signal input can be fed to the differential amplifier, whereby stable amplification can always be provided.

32 Claims, 9 Drawing Sheets

AMPLIFIER FOR BURST SIGNAL AND OPTICAL RECEIVING CIRCUIT

BACKGROUND OF THE INVENTION

1. Field of the invention

The present invention relates to an amplifier and an optical receiving circuit using the amplifier, and more particularly, to an amplifier for amplifying a burst signal (a signal which intermittently appears) and an optical receiving circuit using the amplifier.

2. Description of the Background Art

In a signal amplifier in an optical receiving circuit handling a continuous signal, a system constructed by AC coupling for detecting the average value of the signal and giving the average value as the level of the threshold value of a comparator for judging one or zero has been employed.

In an optical receiving circuit handling small optical receiving power, signals having values to several millivolts must be amplified, whereby a circuit design capable of restraining an output variation due to a temperature variation and a power supply voltage variation to the utmost is indispensable.

The AC coupling system has been most commonly used because it is easily feasible to stably operate each amplifier because the bias in the amplifier is relatively stable against a power supply voltage variation and a temperature variation.

In recent years, in the field of an optical subscriber system and an optical interconnection system, however, the necessity of handling a burst signal for intermittently exchanging a light signal has been increased, and an optical receiving circuit corresponding thereto has been requested.

Particularly in the optical subscriber system, it has been necessary to consider its application range to include the utilization of outdoors applications, for example, whereby the necessity of ensuring stable operations in a temperature range wider than that in the conventional example has been increased.

When the optical receiving circuit with the conventional AC coupling system receives a burst signal, the average value of a received signal greatly varies at the lead of the burst signal, whereby the signal cannot be accurately reproduced in the vicinity of the lead of the burst signal.

As a receiver handing a burst signal, therefore, a DC coupling system is required. However, the DC coupling system has the disadvantage in that the bias is easily affected by a temperature variation and a power supply voltage variation. This will be described in more detail below.

Conventional examples of an optical receiving circuit using the DC coupling system as a basis include an optical receiving circuit disclosed in Japanese Patent Laid-Open No. 310967/1994 (hereinafter referred to as first prior art), and an optical receiving circuit disclosed in Japanese Patent Publication No. 107943/1995 (hereinafter referred to as second prior art), and optical receiving circuit disclosed in U.S. Pat. No. 5,430,766 (hereinafter referred to as third prior art).

The optical receiving circuit in the first prior art makes it possible to reproduce a pulse signal by using an output signal of a preamplifier to which a photodiode is connected as a signal input of a comparator in the succeeding stage and using an intermediate value produced by resistance-separating an output signal of a first peak detecting unit for detecting and holding the maximum value of an output of the preamplifier and an output signal of a second peak detecting unit for detecting and holding the minimum value of the output of the preamplifier as a reference input of the comparator in the succeeding stage.

The optical receiving circuit in the second prior art makes it possible to reproduce a pulse signal by using an output signal of a first transimpedance preamplifier to which a photodiode is connected as a signal input of a comparator in the succeeding stage and using an intermediate value produced by resistance-separating an output signal of a peak detecting unit for detecting and holding the minimum value of an output of a first preamplifier and an output signal of a second preamplifier (a preamplifier to which no photodiode is connected) for outputting the maximum value of the output of the first preamplifier as a reference input of the comparator in the succeeding stage.

The optical receiving circuits in the first prior art and the second prior art are difficult to utilize in a wide temperature range because a temperature variation in the peak detecting unit directly affects an input of the comparator in the succeeding stage. When noise is included in a signal line, an erroneous peak value may be held in response to the noise in the peak detecting unit. Also in this case, accurate signal reproduction becomes difficult to achieve.

On the other hand, the optical receiving circuit in the third prior art comprises a preamplifier using a differential amplifier and a comparator for obtaining a digital output upon input of a differential output from the differential amplifier. In the optical receiving circuit in the third prior art, an output of a peak detecting unit on the side of a positive terminal of a differential output signal is utilized upon being fed back in order to determine the level of a reference input of the differential amplifier constituting the preamplifier. When there are a temperature variation and a power supply voltage variation, therefore, a variation in the output of the peak detecting unit affects an output of the preamplifier, whereby accurate signal reproduction becomes difficult in a wide temperature range. When noise is included in a signal line, an erroneous peak value may be held in response to the nose in the peak detecting unit. Also in this case, accurate signal reproduction becomes difficult to achieve.

In an optical communication system of passive double star construction or the like in which a plurality of terminals are connected to a star coupler, even when the terminals are temporally separated to make signal transmission utilizing a TDMA technique, the light emission levels at the time of no signal transmission at each terminal, in some cases, are added to become a level which cannot be ignored with respect to a signal level. Further, when a system, in which different signals are transmitted in a multi-wavelength utilizing a WDM technique, is employed, it is considered that a light signal having an unnecessary wavelength is received by a photodetector as background light if the isolation of wavelength division multiplexing light is insufficient in an optical module.

In the optical receiving circuit in the third prior art, two peak detecting units for detecting and holding the respective maximum values of differential outputs of the preamplifier are provided in order to avoid the above-mentioned effect of the background light, to carry out such feedback control as to find the difference between outputs of the two peak detecting units and control a current source so that there is no difference. In such construction, however, two feedback loops are used, whereby the most suitable setting of the time constant involves a difficulty.

SUMMARY OF THE INVENTION

An object of the present invention is to provide an amplifier capable of always accurately reproducing a signal under various operating environments (for example, such environments that there exists a variation in ambient temperature, a variation in a power supply voltage, inclusion of noise from a power supply or the like, or inclusion of background light) and an optical receiving circuit using the amplifier.

In order to attain the above-mentioned object, the present invention has the following characteristics.

A first aspect of the present invention is directed to an amplifier for amplifying an inputted burst signal, which comprises.

a first amplifier circuit for amplifying the burst signal and outputting the result of the amplification in the form of a differential output including first and second outputs appearing so as to be longitudinally symmetrical with respect to an offset voltage which is its output voltage in a case where there is no input;

a first peak value holding circuit for detecting and holding a peak value of the first output of the first amplifier circuit;

a second peak value holding circuit for detecting and holding a peak value of the second output of the first amplifier circuit (a peak value in the same direction as the peak value detected by the first peak value holding circuit); and a second amplifier circuit for differentially amplifying outputs of the first and second peak value holding circuits to generate a reference voltage following the DC level of the first output of the first amplifier circuit.

In the first aspect, both the first and second peak value holding circuits respectively detect the peak values in the same direction, whereby output variations also respectively appear in the same direction. If the outputs of the first and second peak value holding circuits are differentially amplified by the second amplifier circuit, both the output variations are canceled, whereby an accurate reference voltage is obtained. Even when a power supply voltage variation and a temperature variation occur, the variation in the peak value holding circuit can be absorbed, whereby the burst signal can be accurately amplified in the simple construction.

A second aspect of the present invention is characterized in that in the first aspect, the amplification factor of the second amplifier circuit is set in the vicinity of 0.5, and an offset voltage which is an output voltage in a case where there is no differential input of the second amplifier circuit is so set as to be approximately equal to the offset voltage of the first amplifier circuit.

In the second aspect, the amplification factor of the second amplifier circuit is set to 0.5, and the offset voltage thereof is so set as to be equal to the offset voltage of the first amplifier circuit, so that the level of the reference voltage outputted from the second amplifier circuit is accurately aligned with the center of the signal amplitude of the first output in the first amplifier circuit.

A third aspect of the present invention is characterized in that in the second aspect, the first and second amplifier circuits are so adapted such that their respective designs and circuit constants are determined upon being related to each other in order that output variations caused by respective internal circuits are equal to each other.

According to the construction in the third aspect, the same variations as the output variation occurring in the first amplifier circuit respectively appear in the same direction in the first and second peak value holding circuits, whereby the variation is superimposed on the reference voltage of the second amplifier circuit. The output variation occurring in the first amplifier circuit is canceled in providing the differential amplification in the second amplifier circuit. As equivalently viewed, therefore, the reference voltage outputted from the second amplifier circuit includes only the output variation occurring in the first amplifier circuit. The first and second amplifier circuits are so constructed that the output variations are equal to each other, whereby the reference voltage accurately follows the variation of a signal outputted from the first amplifier circuit.

A fourth aspect of the present invention is characterized in that in the third aspect, the first and second peak value holding circuits have the same circuit design.

According to the construction in the fourth aspect, the variations occurring in the first and second peak value holding circuits become equal, whereby the variations can be set to approximately zero by providing the differential amplification in the second amplifier circuit.

A fifth aspect of the present invention is characterized in that the fourth aspect, the first and second peak value holding circuits respectively comprise first and second maximum value holding circuits for detecting and holding the maximum values of the first and second outputs of the first amplifier circuit.

A sixth aspect of the present invention is characterized in that in the third aspect, the first amplifier circuit at least comprises:
first and second transistors having their respective emitters together connected;
a first current source connected to the emitters together connected of the first and second transistors;
a first resistor interposed between the collector of the first transistor and a power supply line; and
a second resistor interposed between the collector of the second transistor and the power supply line, and the second amplifier circuit at least comprises:
third and fourth transistors;
a third resistor having its one end connected to the emitter of the third transistor;
a fourth resistor interposed between the collector of the third transistor and the power supply line and having the same resistance value as that of the first resistor;
a fifth resistor having its one end connected to the emitter of the fourth transistor and having the same resistance value as that of the third resistor;
a sixth resistor interposed between the collector of the fourth transistor and the power supply line and having the same resistance value as that of the second resistor; and
a second current source connected to the respective other ends of the third and fifth resistors and having the same structure as that of the first current source, a current flowing therethrough being the same in value as a current flowing through the first current source.

A seventh aspect of the present invention is characterized in that in the first aspect, the first amplifier circuit comprises a differential amplifier receiving the burst signal as a signal input and receiving a fixed voltage temporarily set with respect to the DC level of the burst signal as a reference input, for differentially amplifying the burst signal on the basis of the fixed voltage.

An eighth aspect of the present invention is characterized by further comprising, in the first aspect, a third amplifier circuit receiving the first output of the first amplifier circuit as a signal input and receiving the reference voltage outputted from the second amplifier circuit as a reference input, for differentially amplifying the first output on the basis of the reference voltage.

A ninth aspect of the present invention is characterized by further comprising, in the first aspect, a comparator receiving the first output of the first amplifier circuit as a signal input and receiving the reference voltage outputted from the second amplifier circuit as a reference input, for discriminating the first output with the reference voltage taken as a threshold value, to shape the output of the first amplifier circuit into a digital waveform.

A tenth aspect of the present invention is directed to an optical receiving circuit for receiving an optical burst signal and amplifying the received optical burst signal, which comprises:

a photodetector for converting the received optical burst signal into a current signal;

a first amplifier circuit for converting the current signal from the photodetector into a voltage signal and amplifying the voltage signal, and outputting the result of the amplification in the form of a differential output including first and second outputs appearing so as to be longitudinally symmetrical with respect to an offset voltage which is its output voltage in a case where there is no input;

a first peak value holding circuit for detecting and holding a peak value of the first output of the first amplifier circuit;

a second peak value holding circuit for detecting and holding a peak value of the second output of the first amplifier circuit (a peak value in the same direction as the peak value detected by the first peak value holding circuit); and a second amplifier circuit for differentially amplifying outputs of the first and second peak value holding circuits, to generate a reference voltage following the DC level of the first output of the first amplifier circuit.

In the tenth aspect, both the first and second peak value holding circuits respectively detect the peak values in the same direction, whereby output variations also respectively appear in the same direction. If the outputs of the first and second peak value holding circuits are differentially amplified by the second amplifier circuit, both the output variations are canceled, whereby an accurate reference voltage is obtained. Consequently, the variation in the peak value holding circuit with a temperature variation and a power supply voltage variation can be absorbed, whereby the burst signal can be accurately amplified in the simple construction.

An eleventh aspect of the present invention is characterized in that in the tenth aspect, the amplification factor of the second amplifier circuit is set in the vicinity of 0.5, and an offset voltage which is an output voltage in a case where there is no differential input of the second amplifier circuit is set so as to be approximately equal to the offset voltage of the first amplifier circuit.

In the eleventh aspect, the amplification factor of the second amplifier circuit is set to 0.5, and the offset voltage thereof is set so as to be equal to the offset voltage of the first amplifier circuit, so that the level of the reference voltage outputted from the second amplifier circuit is accurately coincident with the center of the signal amplitude of the first output in the first amplifier circuit.

A twelfth aspect of the present invention is characterized in that in the eleventh aspect, the first and second amplifier circuits are adapted such that their respective circuit designs and circuit constants are determined upon being related to each other in order that output variations caused by respective internal circuits are equal to each other.

According to the construction in the twelfth aspect, the same variations as the output variation occurring in the first amplifier circuit respectively appear in the same direction in the first and second peak value holding circuits, whereby the variations are superimposed on the reference voltage of the second amplifier circuit. The output variation occurring in the first amplifier circuit is canceled in providing the differential amplification in the second amplifier circuit. As equivalently viewed, therefore, the reference voltage outputted from the second amplifier circuit includes only the output variation occurring in the first amplifier circuit. Since the first and second amplifier circuits are constructed such that the output variations are equal to each other, the reference voltage accurately follows the variation of a signal outputted from the first amplifier circuit.

A thirteenth aspect of the present invention is characterized in that in the twelfth aspect, the first and second peak value holding circuits have the same circuit design.

According to the construction in the thirteenth aspect, the variations occurring in the first and second peak value holding circuits become equal, whereby the variations can be set to approximately zero by providing the differential amplifier in the second amplifier circuit.

A fourteenth aspect of the present invention is characterized in that in the thirteenth aspect, the first and second peak value holding circuits respectively comprise first and second maximum value holding circuits for detecting and holding the maximum values of the first and second outputs of the first amplifier circuit.

A fifteenth aspect of the present invention is characterized in that in the twelfth aspect, the first amplifier circuit comprises at least a first differential amplifier, first and second emitter followers, and first and second feedback resistors, the first differential amplifier comprising:

first and second transistors having their respective emitters connected together;

a first current source connected to the emitters together connected of the first and second transistors;

a first resistor interposed between the collector of the first transistor and a power supply line; and a second resistor interposed between the collector of the second transistor and the power supply line, a current signal outputted from the photodetector being fed to the base of the first transistor, an inverting output of the first differential amplifier which is obtained from the collector of the first transistor being outputted through the first emitter follower, a non-inverting output of the first differential amplifier which is obtained from the collector of the second transistor being outputted through the second emitter follower, an output of the first emitter follower being fed back to the base of the first transistor through the first feedback resistor, an output of the second emitter follower being fed back to the base of the second transistor through the second feedback resistor, and second amplifier circuit comprises:
a third transistor having its base receiving the output of the first peak value holding circuit;
a fourth transistor having its base receiving the output of the second peak value holding circuit;
a third resistor interposed between the collector of the third transistor and the power supply line and having the same resistance value as that of the first resistor;
a fourth resistor interposed between the collector of the fourth transistor and the power supply line and having the same resistance value as that of the second resistor;
a fifth resistor having its one end connected to the emitter of the third transistor;
a sixth resistor having its one end connected to the emitter of the fourth transistor;
a second current source connected to the respective other ends of the fifth and sixth resistors and having the same structure as that of the first current source, a current flowing therethrough being the same in value as a current flowing through the first current source; and
a third emitter follower having the same structure as those of the first and second emitter followers and receiving a signal outputted from the collector of the fourth transistor.

In a sixteenth aspect of the present invention is characterized in that in the tenth aspect,
a reset signal is fed to the first and second maximum value holding circuits every time the receiving of the optical burst signal is terminated, and
respective output voltages of the first and second maximum value holding circuits are so set as to be approximately equal to the offset voltage of the first amplifier circuit in response to the reset signal.

According to the construction in the sixteenth aspect, the output voltages of the first and second maximum value holding circuits are reset every time the receiving of the optical burst signal is terminated, whereby the signal can be accurately reproduced even when there is a significant level difference from the previously received optical burst signal.

A seventeenth aspect of the present invention is characterized by further comprising, in the tenth aspect,
a third amplifier circuit receiving the first output of the first amplifier circuit as a signal input and receiving the reference voltage outputted from the second amplifier circuit as a reference input, for differentially amplifying the first output on the basis of the reference voltage.

An eighteenth aspect of the present invention is characterized by further comprising, in the seventeenth aspect,
a comparator for discriminating an output of the third amplifier circuit with the level of the reference input taken as a threshold value, to shape the output of the third amplifier circuit into a digital waveform,
the level of the reference input of the comparator being set to a level which is the sum of the level of the output of the third amplifier in a case where no optical burst signal is inputted and an offset corresponding to noise amplitude.

According to the construction in the eighteenth aspect, a low level is always outputted as a digital output in a case where no optical burst signal is inputted, whereby a retiming circuit or the like connected to the succeeding stage can be prevented from being erroneously operated.

A nineteenth aspect of the present invention is characterized by further comprising, in the tenth aspect,
a comparator receiving the first output of the first amplifier circuit as a signal input and receiving the reference voltage outputted from the second amplifier circuit as a reference input, for discriminating the first output with the reference voltage taken as a threshold value, to shape the output of the first amplifier circuit into a digital waveform.

A twentieth aspect of the present invention is directed to an optical receiving circuit for receiving an optical burst signal and amplifying the received optical burst signal, which comprises:
a photodetector for converting the received optical burst signal into a current signal;
a preamplifier circuit for converting the current signal from the photodetector into a voltage signal and amplifying the voltage signal;
a reference voltage generating circuit for generating a reference voltage; and
a main amplifier circuit for amplifying an output of the preamplifier circuit,
the main amplifier circuit comprising:
a first amplifier circuit receiving the output of the preamplifier circuit as a signal input and receiving an output of the reference voltage generating circuit as a reference input, further differentially amplifying the signal input on the basis of the reference input, and outputting the result of the amplification in the form of a differential output including first and second outputs appearing so as to be longitudinally symmetrical with respect to an offset voltage which is its output voltage in a case where there is no input;
a first peak value holding circuit for detecting and holding a peak value of the first output of the first amplifier circuit;
a second peak value holding circuit for detecting and holding a peak value of the second output of the first amplifier circuit (a peak value in the same direction as the peak value detected by the first peak value holding circuit); and
a second amplifier circuit for differentially amplifying outputs of the first and second peak value holding circuits, to generate a reference voltage following the DC level of the first output of the first amplifier circuit.

In the twentieth aspect, both the first and second peak value holding circuits included in the main amplifier circuit respectively detect the peak values in the same direction, whereby output variations also respectively appear in the same direction. If the outputs of the first and second peak value holding circuits are differentially amplified by the second amplifier circuit, therefore, both the respective output variations are canceled, whereby an accurate reference voltage is obtained. Consequently, the variation in the peak value holding circuit with a temperature variation and a power supply voltage variation can be absorbed, whereby the burst signal can be accurately amplified in the simple construction.

A twenty-first aspect of the present invention is characterized in that in the twentieth aspect,
the amplification factor of the second amplifier circuit is set in the vicinity of 0.5, and
an offset voltage which is an output voltage in a case where there is no differential input of the second amplifier circuit is set so as to be approximately equal to the offset voltage of the first amplifier circuit.

In the twenty-first aspect, the amplification factor of the second amplifier circuit is set in the vicinity of 0.5, and the offset voltage thereof is set so as to be approximately equal to the offset voltage of the first amplifier circuit, so that the level of the reference voltage outputted from the second amplifier circuit is accurately aligned with the center of the signal amplitude of the first output in the first amplifier circuit.

A twenty-second aspect of the present invention is characterized in that in the twenty-first aspect, the first and second amplifier circuits are adapted such that their respective circuit designs and circuit constants are determined upon being related to each other in order that output variations caused by respective internal circuits are equal to each other.

According to the construction in the twenty-second aspect, the same variations as the output variation occurring in the first amplifier circuit respectively appear in the same direction in the first and second peak value holding circuits, whereby the variation is superimposed on the reference voltage of the second amplifier circuit. The output variation occurring in the first amplifier circuit is canceled in providing the differential amplification in the second amplifier circuit. As equivalently viewed, therefore, the reference voltage outputted from the second amplifier circuit includes only the output variation occurring in the first amplifier circuit. Since the first and second amplifier circuits are constructed such that the output variations are equal to each other, the reference voltage accurately follows the variation in a signal outputted from the first amplifier circuit.

A twenty-third aspect of the present invention is characterized in that in the twenty-second aspect, the first and second peak value holding circuits have the same circuit design.

According to the construction in the twenty-third aspect, the variations occurring in the first and second peak value holding circuits become equal, whereby the variations can be set approximately zero by providing the differential amplification in the second amplifier circuit.

A twenty-fourth aspect of the present invention is characterized in that in the twenty-third aspect, the first and second peak value holding circuits respectively comprise first and second maximum value holding circuits for detecting and holding the maximum values of the first and second outputs of the first amplifier circuit.

A twenty-fifth aspect of the present invention is characterized in that in the twenty-fourth aspect, the reference voltage generating circuit is constituted by a fixed voltage power supply.

A twenty-sixth aspect of the present invention is characterized in that in the twenty-fourth aspect, the reference voltage generating circuit detects the maximum value and the minimum value of an output signal from the preamplifier circuit, and outputs a value intermediate therebetween.

A twenty-seventh aspect of the present invention is characterized in that in the twenty-second aspect, the first amplifier circuit comprises:
a first transistor having its base receiving the output of the preamplifier circuit;
a second transistor having its base receiving the output of the reference voltage generating circuit;
a first resistor interposed between the collector of the first transistor and a power supply line;
a second resistor interposed between the collector of the second transistor and the power supply line;
a first current source;
a third resistor interposed between the emitter of the first transistor and the first current source; and
a fourth resistor interposed between the emitter of the second transistor and the first current source and having the same resistance value as that of the third resistor, and the second amplifier circuit comprises:
a third transistor having its base receiving the output of the first peak value holding circuit;
a fourth transistor having its base receiving the output of the second peak value holding circuit;
a fifth resistor interposed between the collector of the third transistor and the power supply line and having the same resistance value as that of the first resistor;
a sixth resistor interposed between the collector of the fourth transistor and the power supply line and having the same resistance value as that of the second resistor;
a second current source having the same structure as that of the first current source, a current flowing therethrough being the same in value as a current flowing through the first current source;
a seventh resistor interposed between the emitter of the third transistor and the second current source and having the same resistance value as that of the fifth resistor; and
an eighth resistor interposed between the emitter of the fourth transistor and the second current source and having the same resistance value as that of the sixth resistor.

A twenty-eighth aspect of the present invention is characterized in that in the twentieth aspect, a reset signal is fed to the first and second maximum value holding circuits every time the receiving of the optical burst signal is terminated, and respective output voltages of the first and second maximum value holding circuits are set so as to be approximately equal to the offset voltage of the first amplifier circuit in response to the reset signal.

According to the construction in the twenty-eighth aspect, the output voltages of the first and second maximum value holding circuits are reset every time the receiving of the optical burst signal is terminated, whereby the signal can be accurately reproduced even when there is a significant level difference in the received optical burst signal.

A twenty-ninth aspect of the present invention is characterized in that in the twentieth aspect, the main amplifier circuit is of multi-stage construction such that a plurality of amplifier units each comprising the first and second amplifier circuits and the first and second peak value holding circuits are connected in cascade, and the first amplifier circuit in the amplifier unit in each of the second stage and the succeeding stages receives as a signal input the first output of the first amplifier circuit in the amplifier unit in the preceding stage, and receives as a reference input the output of the second amplifier circuit in the amplifier unit in the preceding stage.

A thirtieth aspect of the present invention is characterized in that in the twenty-ninth aspect, the amplification factor of the amplifier unit in the first stage in the main amplifier circuit is set so as to be lower than the amplification factors of the amplifier units in the second stage and the succeeding stages.

According to the construction in the thirtieth aspect, the amplification factor of the amplifier unit in the first stage in the main amplifier circuit is set so as to be lower than the amplification factors of the amplifier units in the second stage and the succeeding stages. Even when the output of the reference voltage generating unit deviates slightly from a signal component due to a temperature variation and a power supply voltage variation, the reference voltage level can be accurately set in the center of the signal amplitude at the second stage and the succeeding stages because the linear amplification region of the first amplifier in the first stage is widened. Further, the signal can be amplified to a sufficient level in the amplifier units in the second stage and the succeeding stages.

In a thirty-first aspect of the present invention is characterized by further comprising, in the thirtieth aspect, a comparator receiving as a signal input the first output of the first amplifier circuit in the amplifier unit in the final stage in the main amplifier circuit and receiving as the reference input the reference voltage outputted from the second amplifier circuit, for discriminating the first output with the reference voltage taken as a threshold value, to shape the output of the first amplifier circuit into a digital waveform.

A thirty-second aspect of the present invention is characterized in that in the thirty-first aspect, the level of the reference input of the comparator is set to a level which is the sum of the level of the output of the second amplifier circuit in the amplifier unit in the final stage in a case where no optical burst signal is inputted and an offset corresponding to noise amplitude.

According to the construction in the thirty-second aspect, a low level is always outputted as a digital output in a case where no optical burst signal is inputted, whereby a retiming circuit or the like connected to the succeeding stage can be prevented from being erroneously operated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
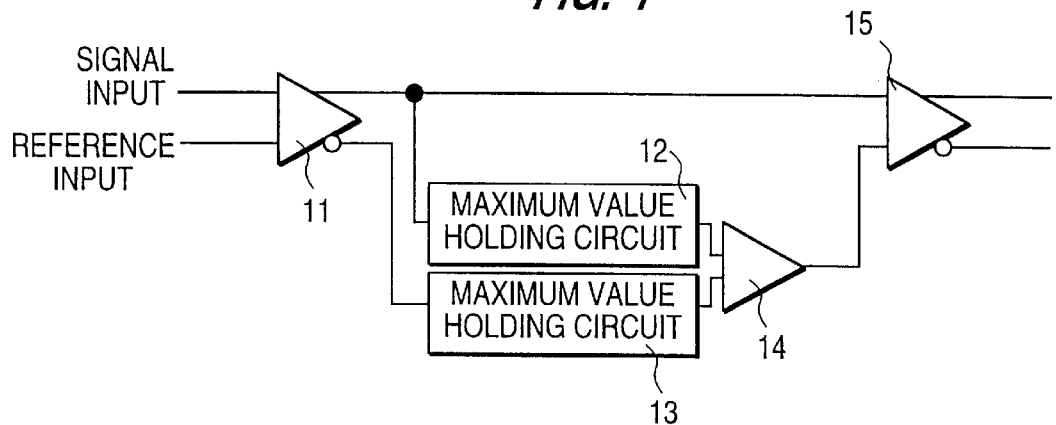
FIG. 1 is a block diagram showing the construction of an amplifier according to a first embodiment of the present invention.

FIG. 1 is a block diagram showing the construction of an amplifier for a burst signal according to a first embodiment of the present invention. In FIG. 1, the amplifier in the present embodiment comprises three differential amplifiers 11, 14 and 15 and two maximum value holding circuits 12 and 13.

A burst signal to be amplified as a signal input is fed to the differential amplifier 11, and a fixed voltage (generated by a constant-voltage power supply for example (not shown) is fed thereto as a reference input. The fixed voltage serving as the reference input is set to such a value that the differential amplifier 11 can always amplify the signal input in a linear amplification region. The differential amplifier 11 amplifies the signal input on the basis of the fed reference input. The results of the amplification are taken out in the form of a differential output, that is, in the form of a non-inverting output and an inverting output from the differential amplifier 11. The maximum value holding circuit 12 detects and holds the maximum value of the non-inverting output of the differential amplifier 11. The maximum value holding circuit 13 has the same circuit design as that of the maximum value holding circuit 12, and detects and holds the maximum value of the inverting output of the differential amplifier 11. An output of the maximum value holding circuit 12 is fed as a signal input to the differential amplifier 14, and an output of the maximum value holding circuit 13 is fed thereto as a reference input. The amplification factor of the differential amplifier 14 is set to 0.5. The differential amplifier 14 is so constructed that its output voltage in a case where there is no differential input is the same as an output voltage in a case where there is no differential input of the differential amplifier 11. An output of the differential amplifier 14 is a non-inverting output. The non-inverting output of the differential amplifier 11 is fed as a signal input to the differential amplifier 15, and the output of the differential amplifier 14 is fed thereto as a reference input. The amplification factor of the differential amplifier 15 is set to a predetermined value.

Figure 2:
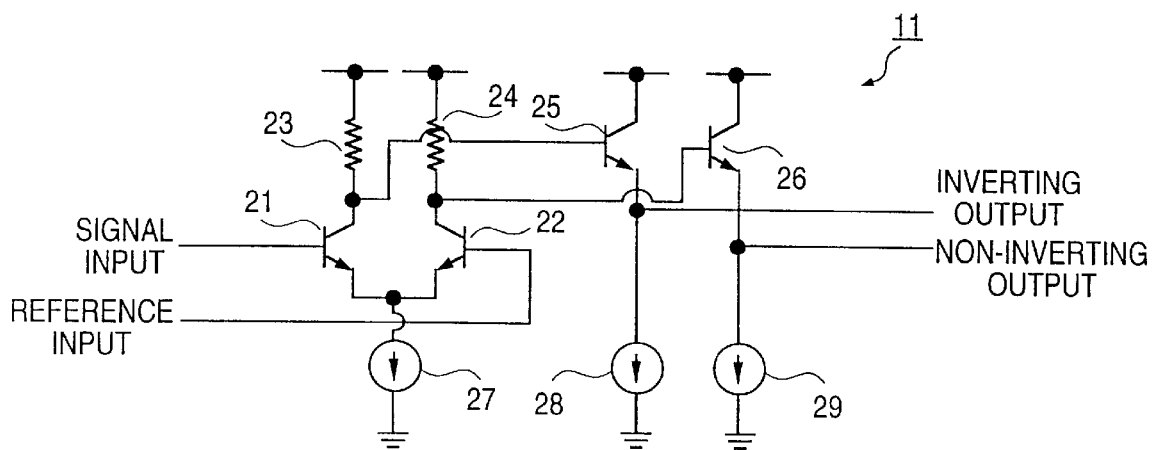
FIG. 2 is a circuit diagram showing one example of the circuit design of a differential amplifier 11 used in the amplifier shown in FIG. 1.

FIG. 2 is a diagram showing one example of the circuit design of the differential amplifier 11 shown in FIG. 1. In FIG. 2, a current source 27 is connected to the respective emitters of transistors 21 and 22 together connected. A resistor 23 is connected to the collector of the transistor 21, and a resistor 24 having the same resistance value as that of the resistor 23 is connected to the collector of the transistor 22. A signal input is fed to the base of the transistor 21, and a reference input is fed to the base of the transistor 22. The output taken out from the collector of the transistor 21 is connected to an emitter follower which is constituted by a transistor 25 and a current source 28, after which the signal obtained by the impedance conversion is provided as an inverting output. The output taken out from the collector of the transistor 22 is connected to an emitter follower which is a constituted by a transistor 26 and a current source 29, after which the signal obtained by the impedance conversion is provided as a non-inverting output.

Figure 3:
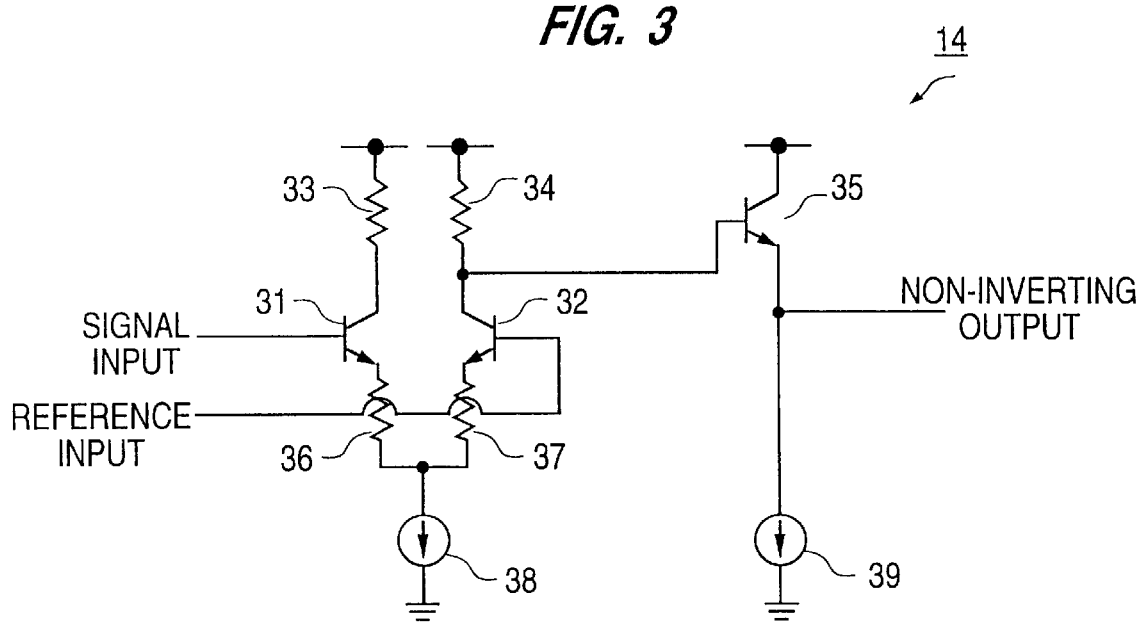
FIG. 3 is a circuit diagram showing one example of the circuit design of a differential amplifier 14 used in the amplifier shown in FIG. 1.

FIG. 3 is a diagram showing one example of the circuit design of the differential amplifier 14 shown in FIG. 1. In FIG. 3, a resistor 36 is connected to the emitter of a transistor 31, and a resistor 33 is connected to the collector thereof. A resistor 37 is connected to the emitter of a transistor 32, and a resistor 34 is connected to the collector thereof. The resistors 36 and 37 are connected to a current source 38. The resistors 33 and 34 respectively have the same resistance values as those of the resistors 23 and 24. The output taken out from the collector of the transistor 32 is connected to an emitter follower which is constituted by a transistor 35 and a current source 39, after which the signal obtained by the impedance conversion is provided as a non-inverting output. A signal input is fed to the base of the transistor 31, and a reference input is fed to the base of the transistor 32.

The resistors 36 and 37 are utilized as local negative feedback resistors. When the values of the transconductance of the transistors 31 and 32 are a sufficiently large value, the amplification factor of the differential amplifier becomes 0.5 by setting the resistance values of the resistors 36 and 37 to the same values as those of the resistors 33 and 34.

The current source 38 has the same structure as that of the current source 27 shown in FIG. 2, and a current flowing therethrough is the same in value as a current flowing through the current source 27. The current source 39 has the same structure as that of the current sources 28 and 29 shown in FIG. 2, and a current flowing therethrough is the same in value as that of a current flowing through the current sources 28 and 29.

Figure 4A:
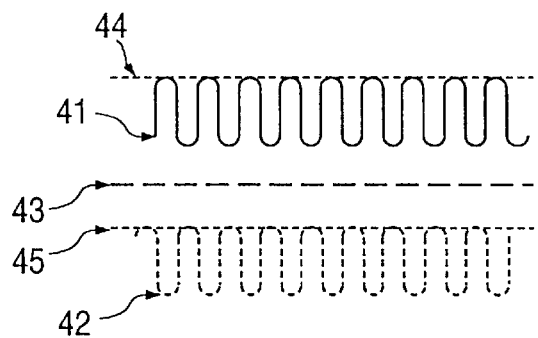
FIG. 4 is a waveform diagram showing signals in respective units in the amplifier shown in FIG. 1.
Figure 4B:
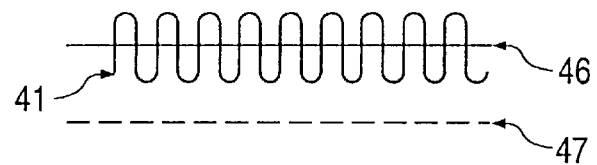

FIG. 4 is a waveform diagram showing signals in the respective units in the embodiment shown in FIG. 1. In FIG. 4 (a), waveforms 41 and 42 are respectively signal waveforms of the non-inverting output and the inverting output of the differential amplifier 11. In FIG. 4 (a), waveforms 44 and 45 are respectively output waveforms of the maximum value holding circuits 12 and 13. In FIG. 4 (a), a waveform 43 represents an offset voltage of the differential amplifier 11, that is, the output voltage thereof in a case where there is no differential input. In FIG. 4 (b), a waveform 46 is an output waveform of the differential amplifier 14. In FIG. 4 (b), a waveform 47 represents an offset voltage of the differential amplifier 14, that is, the output voltage thereof in a case where there is no differential input. Referring now to FIG. 4, description is made of operations performed by the amplifier shown in FIG. 1.

In the differential amplifier 11, when there is no differential input (that is, when there is no voltage difference between the signal input and the reference input), a current set in the current source 27 is split between the resistors 23 and 24 by halves. Consequently, the offset voltage (the waveform 43) of the differential amplifier 11 in a case where there is no differential input is determined as a voltage lower than a power supply voltage by the sum of a voltage between the both end of the resistor 23 or 24 and a voltage between the base and the emitter of the transistor 25 or 26.

Similarly, the offset voltage (the waveform 47) of the differential amplifier 14 in a case where there is no differential input is determined as a voltage lower than the power supply voltage by the sum of a voltage between the both end of the resistor 34 caused by the half of a current whose value is determined by the current source 38 flowing through the resistor 34 and a voltage between the base and the emitter of the transistor 35.

When the current values of the current sources 27 and 38 are made equal, and the resistance values of the resistors 23, 24 and 34 are made equal, the offset voltage (the waveform 43) of the differential amplifier 11 and the offset voltage (the waveform 47) of the differential amplifier 14 take the same value.

The non-inverting output (the waveform 41) and the inverting output (the waveform 42) of the differential amplifier 11 appear in positions which are longitudinally symmetrical with the offset voltage (the waveform 43) interposed therebetween. The differential amplifier 14 finds the difference between the output (the waveform 44) of the maximum value holding circuit 12 and the output (the waveform 45) of the maximum value holding circuit 13, adds a voltage which is 0.5 times the difference to the offset voltage (the waveform 47) which is the output voltage in a case where there is no input, and outputs the result of the addition. Therefore, the output (the waveform 46) of the differential amplifier 14 is positioned in the center of the signal amplitude of the non-inverting output (the waveform 41) of the differential amplifier 11.

When a temperature variation and a power supply voltage variation exist, the current flowing through the current source 27 varies. Consequently, in the non-inverting output and the inverting output of the differential amplifier 11, a variation corresponding to the voltages between both ends of the resistors 23 and 24 occurs in proportion to the variation in the current. The variation appears in the positive direction or the negative direction with respect to both the inverting output and the non-inverting output of the differential amplifier 11. In the maximum value holding circuits 12 and 13, therefore, the respective outputs vary in the same direction upon receipt of an input variation. At this time, variations caused by the internal construction are also added. However, the maximum value holding circuits 12 and 13 have the same structure, and the variations caused by the internal construction appear as variations in the same direction. All the variations in the same direction are canceled by the differential amplifier 14.

In the differential amplifier 14, the current flowing through the current source 38 varies, and a variation corresponding to a voltage between both ends of the resistor 34 occurs in the non-inverting output in proportion to the variation in the current. However, the current source 38 has the same structure and current value as those of the current source 27. Therefore, the caused variation becomes approximately equal to that in the differential amplifier 11. Since the resistance value of the resistor 34 is the same as the resistance values of the resistors 23 and 24, the variation corresponding to the voltage between both ends of the resistor 34 takes the same value as that in the differential amplifier 11. Consequently, the variation of the non-inverting output of the differential amplifier 11 which is fed as the signal input to the differential amplifier 15 and the variation of the non-inverting output of the differential amplifier 14 which is fed as the reference input to the differential amplifier 15 take approximately the same value, whereby the level of the reference input is always set in the vicinity of the center of the signal amplitude appearing in the signal input. As a result, even when there exist a temperature variation and a power supply voltage variation, it is possible to always provide stable amplification.

As described in the foregoing, in the first embodiment, the output variations occurring in the maximum value holding circuits 12 and 13 due to the temperature variation and the power supply voltage variation are canceled by providing the differential amplification in the differential amplifier 14. At this time, the output variation occurring in the differential amplifier 11 is also canceled. The output variation occurring in the differential amplifier 14 is made equal in value to the output variation occurring in the differential amplifier 11, so that the same variation as the signal input is superimposed on the reference input fed to the differential amplifier 15. Consequently, the reference input accurately following the DC level of the signal input can be fed to the differential amplifier 15, whereby it is possible to always provide stable amplification.

Generally, a comparator is arranged in the succeeding stage of the differential amplifier 15, so that an analog signal is converted into a digital signal by the comparator. When the level of the signal input to the differential amplifier 11 is high, however, a signal having a sufficient level is obtained from the differential amplifier 11, whereby the non-inverting output of the differential amplifier 11 and the non-inverting output of the differential amplifier 14 may be directly inputted to the comparator without providing signal amplification in the differential amplifier 15. The comparator discriminates the non-inverting output of the differential amplifier 11 with the non-inverting output of the differential amplifier 14 taken as a threshold value, to convert an analog signal into a digital signal.

(Second Embodiment)

Figure 5:
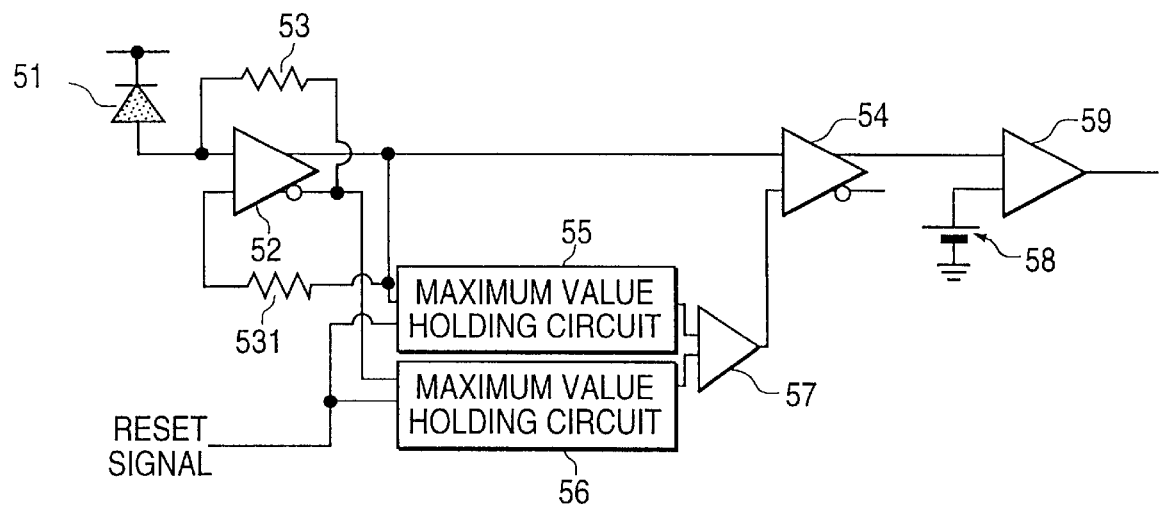
FIG. 5 is a block diagram showing the construction of an optical receiving circuit according to a second embodiment of the present invention.

FIG. 5 is a block diagram showing the construction of an optical receiving circuit according to a second embodiment of the present invention. In FIG. 5, the optical receiving circuit according to the present embodiment comprises a photodetector 51, a preamplifier 52, two maximum value holding circuits 55 and 56, two differential amplifiers 54 and 57, a comparator 59, and a reference voltage power supply 58.

The photodetector 51 is composed of a p-i-n photodiode, for example, to convert a received light signal into a current signal. When the photodetector 51 is composed of a photodiode, its cathode is connected to a power supply line, and its anode is connected to an input terminal of the preamplifier 52. The preamplifier 52 converts a current signal outputted from the photodetector 51 into a voltage signal. The result of the amplification in the preamplifier 52 is taken out in the form of a differential output.

The maximum value holding circuit 55 detects and holds the maximum value of a non-inverting output of the preamplifier 52. An output of the maximum value holding circuit 55 is fed as a signal input to the differential amplifier 57 as described later. The maximum value holding circuit 58 has the same circuit design as that of the maximum value holding circuit 55, and detects and holds the maximum value of an inverting output of the preamplifier 52. An output of the maximum value holding circuit 56 is fed as a reference input to the differential amplifier 57 as described later. A reset signal is externally fed to the maximum value holding circuits 55 and 56.

The non-inverting output of the preamplifier 52 is fed as a signal input to the differential amplifier 54, and an output of the differential amplifier 57 is fed thereto as a reference input. The comparator 59 discriminates an output signal of the differential amplifier 54 with a reference voltage applied from the reference voltage power supply 58 taken as a threshold value, to shape its signal waveform into a digital waveform.

Figure 6:
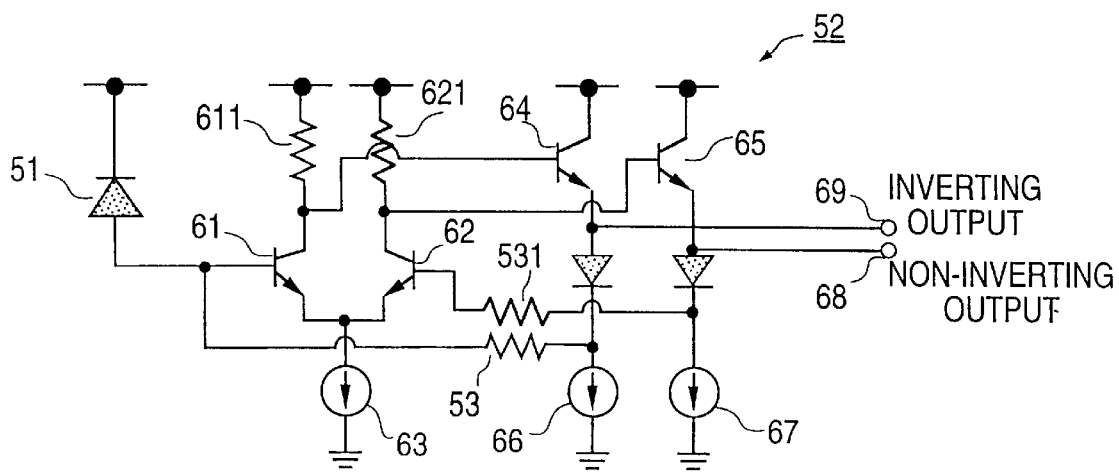
FIG. 6 is a circuit diagram showing one example of the circuit design of a preamplifier 52 used in the optical receiving circuit shown in FIG. 5.

FIG. 6 is a circuit diagram showing one example of the circuit design of the preamplifier 52 shown in FIG. 5. In FIG. 6, translators 61 and 62 and a current source 63 form a differential amplifier. The transistors 61 and 62 have their emitters connected together to the current source 63. An output of the photodetector 51 is fed to the base of the transistor 61. A resistor 611 is interposed between the collector of the transistor 61 and the power supply line, and a resistor 621 is interposed between the collector of the transistor 62 and the power supply line. A transistor 64 and a current source 66 form a first emitter follower circuit, and a transistor 65 and a current source 67 form a second emitter follower circuit. An inverting output of the differential amplifier which is obtained from the collector of the transistor 61 is fed to an output terminal 69 through the first emitter follower circuit. A non-inverting output of the differential amplifier which is obtained from the collector of the transistor 62 is fed to an output terminal 68 through the second emitter follower circuit. Further, an output of the first emitter follower circuit is fed back to the base of the transistor 61 through a feedback resistor 53, and an output of the second emitter follower circuit is fed back to the base of the transistor 62 through a feedback resistor 531.

Figure 7:
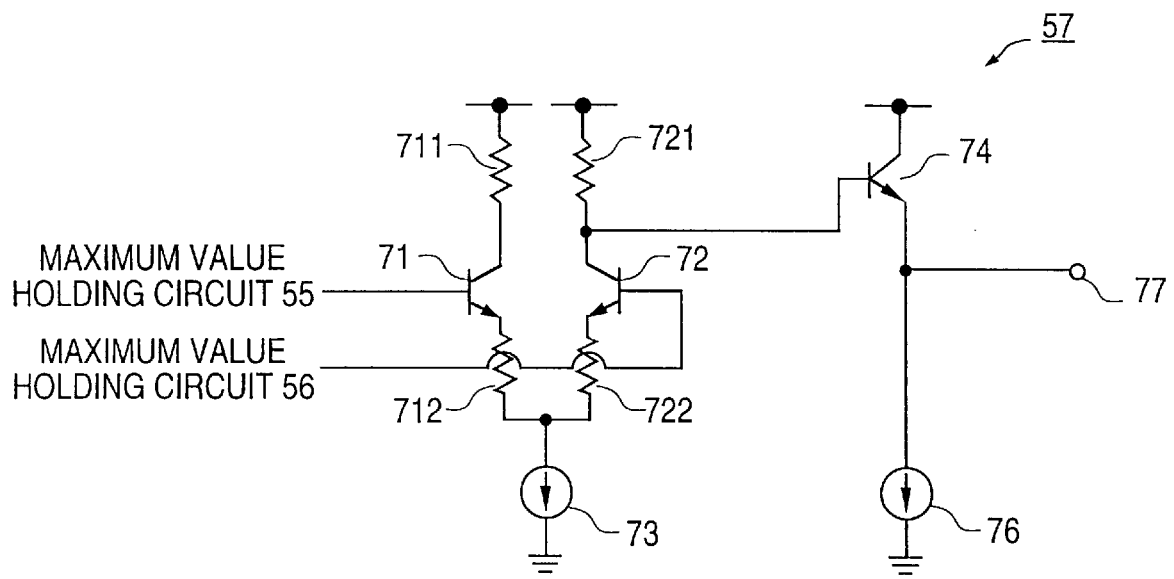
FIG. 7 is a circuit diagram showing one example of the circuit design of a differential amplifier 57 used in the optical receiving circuit shown in FIG. 5.

FIG. 7 is a circuit diagram showing one example of the circuit design of the differential amplifier 57 shown in FIG. 5. In FIG. 7, the output of the maximum value holding circuit 55 is fed to the base of a transistor 71, the output of the maximum value holding circuit 56 is fed to the base of a transistor 72. A resistor 711 is interposed between the power supply line and the collector of the transistor 71, and a resistor 721 is interposed between the power supply line and the collector of the transistor 72. One end of a resistor 712 is connected to the emitter of the transistor 71, and one end of a resistor 722 is connected to the emitter of the transistor 72. The resistors 712 and 722 have their other ends connected to a current source 73. The collector of the transistor 72 is also further connected to the base of a transistor 74. The transistor 74 has its emitter connected to a current source 76. The transistor 74 and the current source 76 form an emitter follower circuit. Further, an output terminal 77 is prepared in such a form as to be connected to the emitter of the transistor 74.

In the above-mentioned construction, the current source 63 of the preamplifier 52 and the current source 73 of the differential amplifier 57 have the same structure, and the values of currents respectively flowing therethrough are set so as to be equal. Resistors 611 and 621 respectively have the same resistance values as those of the resistors 711 and 721. The resistors 712 and 722 respectively have the same resistance values as those of the resistors 711 and 721. A local feedback function is exerted on the resistors 712 and 722. When the values of the transconductance of the transistors 71 and 72 are sufficiently large and the resistors 712 and 722 are so set as to be equal in value to the resistors 711 and 721, the amplification factor of the differential amplifier 57 becomes 0.5.

Figure 8:
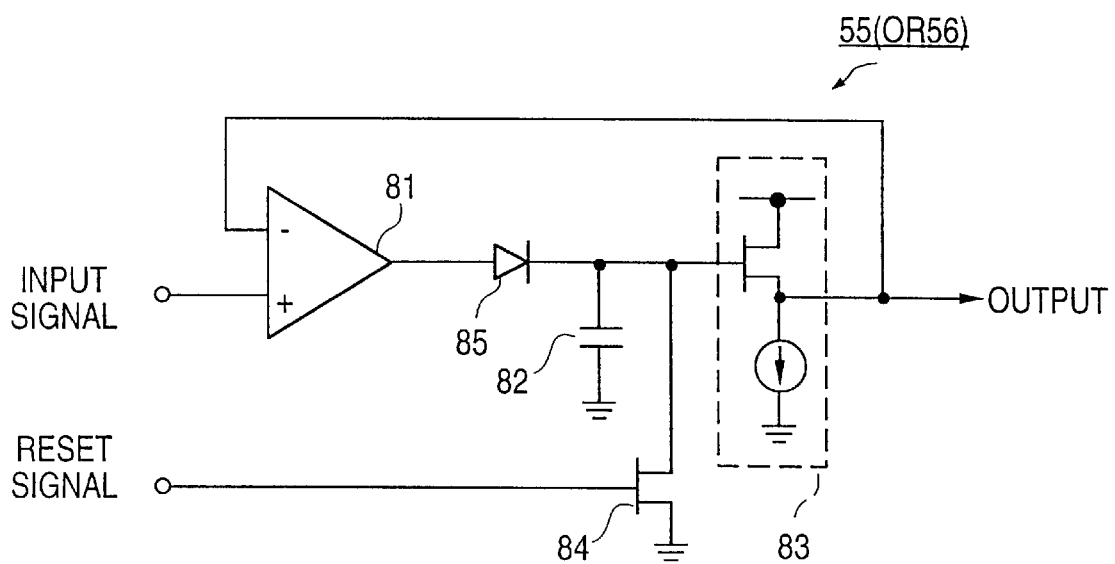
FIG. 8 is a circuit diagram showing one example of the circuit design of a maximum holding circuit 55 (or 56) used in the optical receiving circuit shown in FIG. 5.

FIG. 8 is a diagram showing the more detailed circuit design of the maximum value holding circuit 55 shown in FIG. 5. In FIG. 8, the maximum value holding circuit 55 comprises an operational amplifier 81, a diode 85 receiving an output of the operational amplifier 81, a capacitor 82 storing charge for holding a peak value, a buffer circuit 83 which is constituted by a source follower and the like, and a switch circuit 84 turned on in response to a reset signal and forming a discharge path of the capacitor 82.

Figure 9:
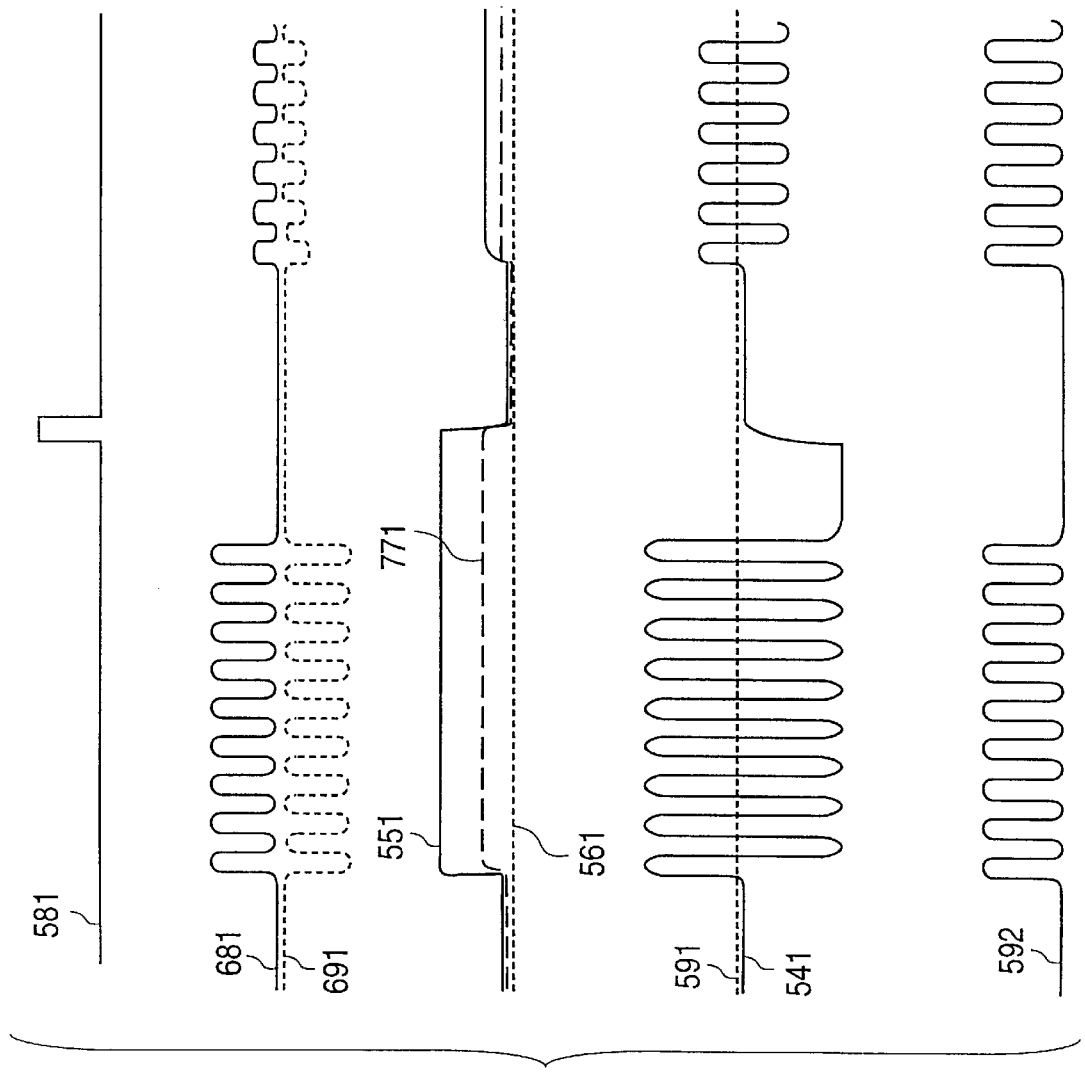
FIG. 9 is a waveform diagram showing signals in respective units in the optical receiving circuit shown in FIG. 5.

FIG. 9 is a waveform diagram showing signals in the respective units in a case where an optical burst signal is inputted in the optical receiving circuit shown in FIG. 5. In FIG. 9, a waveform 581 is a waveform of the reset signal applied to the maximum value holding circuits 55 and 56. A waveform 681 is a waveform of a signal at the output terminal 68 of the preamplifier 52, and a waveform 691 is a waveform of a signal at the output terminal 69 of the preamplifier 52. Further, a waveform 551 is a waveform of an output signal of the maximum value holding circuit 55, and a waveform 561 is a waveform of an output signal of the maximum value holding circuit 56. A waveform 771 is a waveform of an output signal at the output terminal 77 of the differential amplifier 57. Further, a waveform 541 is a waveform of an output signal of the differential amplifier 54, and a waveform 591 represents the level of the reference input of the comparator 59. A waveform 592 is a waveform of an output signal of the comparator 59. Referring now to FIG. 9, description is made of operations performed by the optical receiving circuit shown in FIGS. 5 to 8.

In a state where there is no light signal received, a collector current of the transistor 61 and a collector current of the transistor 62 are the same in the preamplifier 52, so that a current which is one-half the current flowing through the current source 63 flows through each of the transistors 61 and 62. An offset voltage which is an output voltage of the preamplifier 52 in a state where there is no input is the same at the output terminals 68 and 69, and takes a value lower than a power supply voltage by the sum of a voltage between both ends of the resistor 611 or 621 and a voltage between the base and the emitter of the transistor 64 or 65.

On the other hand, when there is no differential input in the differential amplifier 57, respective collector currents of the transistors 71 and 72 are the same, so that a current which is one-half the current flowing through the current source 73 flows through each of the transistors 71 and 72. An offset voltage of the differential amplifier 57 takes a value lower than the power supply voltage by the sum of a voltage between both ends of the resistor 721 and a voltage between the base and the emitter of the transistor 74.

When the current source 63 and the current source 73 take the same current value, and the resistors 611 and 621 and the resistor 721 take the same resistance value, an output level at the output terminal 68 of the preamplifier 52 in a case where no light signal is inputted and an offset output level at the output terminal 77 of the differential amplifier 57 in a case where there is no differential input become equal.

When the optical burst signal is inputted, a non-inverting output signal at the output terminal 68 of the preamplifier 52 is outputted in the way of adding to a level in a case where there is no input as indicated by the waveform 681, and an inverting output signal at the output terminal 69 is outputted in the way of subtracting from a level in a case where there is no input as indicated by the waveform 691. At this time, the output of the maximum value holding circuit 55 follows the maximum value of the non-inverting output of the preamplifier 52, as indicated by the waveform 551. On the other hand, the output of the maximum value holding circuit 56 holds a level in a case where there is no input, as indicated by the waveform 561.

The differential amplifier 57 adds, when a voltage indicated by the waveform 551 is applied thereto as a signal input, and a voltage indicated by the waveform 561 is applied thereto as a reference input, a voltage which is 0.5 times the difference therebetween to an output level in a case where there is no input because the amplification factor thereof is 0.5, and outputs the result of the addition. Therefore, the output of the differential amplifier 57 is as indicated by the waveform 771. Since the output waveform 771 of the differential amplifier 57 attains an approximately intermediate level of the output waveform 681 of the preamplifier 52, whereby the output of the differential amplifier 54 is as indicated by the waveform 541.

In the actual circuit, thermal noise and shot noise in the photodetector and the electrical circuit are superimposed in the output signal indicated by the waveform 541. Therefore, a value to which such an offset as to exceed a peak value of the noise component is added is set as a reference input level 591 of the comparator 59. Consequently, the noise component is removed. That is, an output of the comparator 59 in a case where the signal input is represented by the waveform 541 and the reference input level is represented by the waveform 591 is as represented by the waveform 592. A digital output from the comparator 59 is always at a low level in a case where there is no input. The digital output can be brought into a high level only when a light signal is received. As a result, the burst signal can be reproduced.

Description is now made of operations in a case where there are a temperature variation and a power supply voltage variation.

When the current sources 63 and 73 are made to have the same structure and current value, respective current variations with the power supply voltage variation and the temperature variation can be made equal in the preamplifier 52 and the differential amplifier 57. The same may be said of a case where the current sources 66 and 67 and the current source 76 are made to have the same structure and current value.

The offset voltage of the preamplifier 52 in a state where there is no light signal received is as described above. Further, when the light signal is inputted to the preamplifier 52, the output is as follows. That is, the non-inverting output at the terminal 68 of the preamplifier 52 has signal amplitude in such a shape that a voltage difference corresponding to input light power of the light signal is added to the offset voltage in a case where there is no input on the higher voltage side. On the other hand, the inverting output at the terminal 69 of the preamplifier 52 has signal amplitude in such a shape that a voltage difference corresponding to input light power is subtracted from the offset voltage in a case where there is no input on the lower voltage side.

A variation in the output of the preamplifier 52 in a case where there are a temperature variation and a power supply voltage variation becomes the sum of a variation as a DC component (a variation in the offset voltage) and a variation as an AC component (a variation of the signal amplitude). The variation in the offset voltage which is the variation as the DC component becomes the sum of a variation of the voltage between the both end of the resistor 611 and 621 due to a variation in the current source 63 and a variation between base-emitter voltage in the transistor 64 or 65. The variation in the signal amplitude which is the variation as the AC component is created by a variation in the gainfrequency characteristics of the preamplifier 52 due to the power supply voltage variation and the temperature variation, Output variations in the maximum value holding circuits 55 and 56 due to the temperature variation or the power supply voltage variation become equal by making the respective structures equal. A variation in the output of the differential amplifier 57 in a case where there exist a temperature variation and a power supply voltage variation is the sum of a variation in the offset voltage of the differential amplifier 57 and the output variation in the maximum value holding circuits 55 and 56. The variation in the offset voltage of the differential amplifier 57 becomes the sum of a voltage variation between both ends of the resistor 721 due to the current variation in the current source 73 and a variation in a voltage between the base and the emitter of the transistor 74, and becomes equal to the variation as the DC component in the preamplifier 52 when the current source 73 and the current source 63 have the same structure and current value, and the resistors 611 and 621 and the resistor 721 have the same resistance value.

The maximum value holding circuits 55 and 56 respectively follow the maximum values including the same variation, and the differential amplifier 57 amplifies a difference component between the output of the maximum value holding circuit 55 and the output of the maximum value holding circuit 56. If the variations are the same, the variations are canceled by the differential amplifier 57.

As a result, the output waveform 771 of the differential amplifier 57 always represents a value in the center of the amplitude of a signal appearing in the non-inverting output of the preamplifier 52. Even when there are a temperature variation and a power supply voltage variation, the level of the reference input following a variation in the level of the signal input in the differential amplifier 54 is always obtained, whereby the burst signal can be always accurately outputted by the comparator 59.

The maximum value holding circuits 55 and 56 store charge corresponding to an input signal voltage in a capacitor 82, as shown in FIG. 8, to hold the maximum value of the input signal voltage. In the conventional maximum value holding circuit, charge stored in the capacitor 82 is gradually discharged in accordance with a certain time constant after the receiving and the reproduction of a burst signal are terminated. When an optical burst signal having small amplitude is received after an optical burst signal having large amplitude is received, an input signal voltage corresponding to the optical burst signal having small amplitude may, in some cases, be lower than the residual voltage of the capacitor 82. In such a case, an output voltage of the maximum value holding circuit is made higher than the maximum value of the input signal voltage, whereby the maximum value cannot be detected.

In the optical receiving circuit according to the second embodiment, therefore, the reset signal 581 is fed to the maximum value holding circuits 55 and 56 every time the receiving and the reproduction of the burst signal are terminated. The switch circuit 84 shown in FIG. 8 is turned on in response to the reset signal 581, whereby the charge stored in the capacitor 82 is forcedly discharged. Consequently, the respective outputs 551 and 561 of the maximum value holding circuits 55 and 56 are forcedly reset to the offset voltage which is an output level in a case where no light signal is inputted to the preamplifier 52. Even if an optical burst signal having small amplitude is received after an optical burst signal having large amplitude is received, therefore, the signal can be reproduced.

When the light receiving level of the photodetector 51 is sufficiently high, a signal at a sufficient level is obtained from the preamplifier 52, whereby the output of the preamplifier 52 and the output of the preamplifier 57 may be directly inputted to the comparator 59 without providing signal amplification in the differential amplifier 54. In this case, the comparator 59 discriminates the output of the preamplifier 52 with the output of the differential amplifier 57 taken as a threshold value, to convert an analog signal into a digital signal.

(Third Embodiment)

Figure 10:
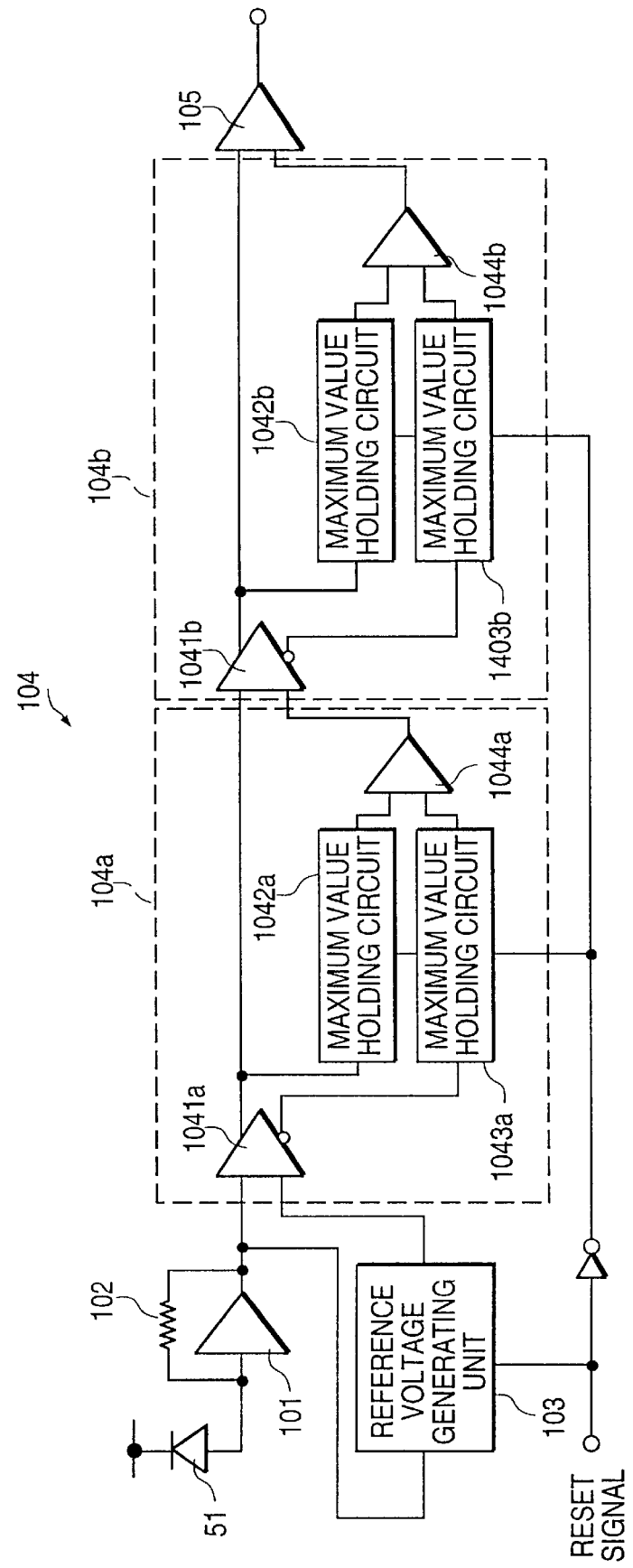
FIG. 10 is a block diagram showing the construction of an optical receiving circuit according to a third embodiment of the present invention.

FIG. 10 is a block diagram showing the construction of an optical receiving circuit according to a third embodiment of the present invention. In FIG. 10, the optical receiving circuit according to the present embodiment comprises a photodetector 51, a preamplifier 101, a feedback resistor 102, a reference voltage generating unit 103, a main amplifier unit 104, and a comparator 105.

In the present embodiment, such construction that first and second amplifier units 104a and 104b having the same structure are connected in cascade is illustrated as the main amplifier unit 104. The first amplifier unit 104a comprises two maximum value holding circuits 1042a and 1043a and two differential amplifiers 1041a and 1044a. Similarly, the second amplifier unit 104b comprises two maximum value holding circuits 1042b and 1043b and two differential amplifiers 1041b and 1044b.

The photodetector 51 is composed of a photodiode, for example, to convert a received light signal into a current signal. When the photodetector 51 is composed of a photodiode, its cathode is connected to a power supply line, and its anode is connected to an input terminal of the preamplifier 101. The preamplifier 101 converts the current signal outputted from the photodetector 51 into a voltage signal.

The reference voltage generating unit 103 generates an output at a DC level which is an approximately central part of the amplitude of an output signal of the preamplifier 101 by the structure further described The output of the reference voltage generating unit 103 is fed as a reference input to the differential amplifier 1041a in the first amplifier unit 104a.

An output of the preamplifier 101 is fed as a signal input to the differential amplifier 1041a. A non-inverting output and an inverting output of the differential amplifier 1041a are respectively fed to the maximum value holding circuits 1042a and 1043a.

Outputs of the maximum value holding circuit 1042a and 1043a are respectively fed as a signal input and a reference input to the differential amplifier 1044a. The maximum value holding circuits 1042a and 1043a have the same circuit design. A reset signal is externally fed to the maximum value holding circuits 1042a and 1043a. The non-inverting output of the differential amplifier 1041a is fed as a signal input to the differential amplifier 1041b in the second amplifier unit 104b in the succeeding stage. The non-inverting output of the differential amplifier 1044a is fed as a reference input to the differential amplifier 1041b.

A non-inverting output and an inverting output of the differential amplifier 1041b are respectively fed to the maximum value holding circuits 1042b and 1043b. Outputs of the maximum value holding circuits 1042b and 1043b are respectively fed as a signal input and a reference input to the differential amplifier 1044b. The maximum value holding circuits 1042b and 1043b have the same circuit design. A reset signal is externally fed to the maximum value holding circuits 1042b and 1043b.

The non-inverting output of the differential amplifier 1041b is fed as a signal input to the comparator 105 in the succeeding stage. A non-inverting output of the differential amplifier 1044b is fed as a reference input to the comparator 105, The comparator 105 discriminates the signal input with the reference input taken as a threshold value, to shape the waveform of a light receiving signal into a digital waveform.

Figure 11:
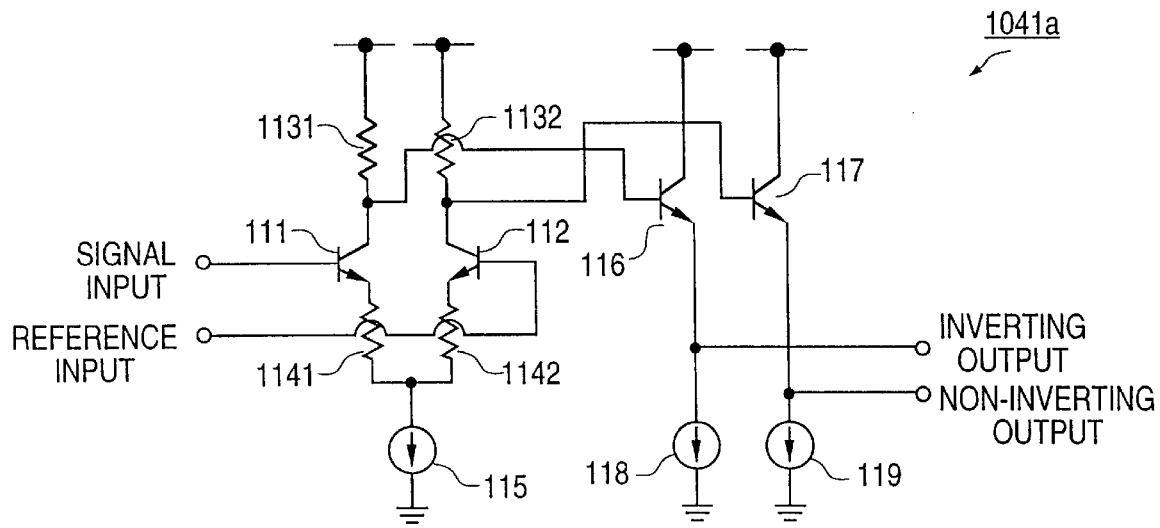
FIG. 11 is a circuit diagram showing one example of the circuit design of a differential amplifier 1041 used in the optical receiving circuit shown in FIG. 10.

FIG. 11 is a circuit diagram showing one example of the circuit design of the differential amplifier 1041a shown in FIG. 10. In advance it is pointed out that the differential amplifier 1041b also has the same circuit design as that of the differential amplifier 1041a. In FIG. 11, a transistor 111 has its collector connected to a power supply line through a resistor 1131. A transistor 112 has its collector connected to the power supply line through a resistor 1132. The transistor 111 has its emitter connected to a current source 115 through a resistor 1141. The transistor 112 has its emitter connected to the current source 115 through a resistor 1142. The signal input from the preamplifier 101 is fed to the base of the transistor 111. The reference input from the reference voltage generating unit 103 is fed to the base of the transistor 112.

A collector output of the transistor 111 is fed to the base of a transistor 116. A collector output of the transistor 112 is fed to the base of a transistor 117. The transistors 116 and 117 have their respective collectors connected to the power supply line. The transistor 116 has its emitter connected to a current source 118. The transistor 117 has its emitter connected to a current source 119. The transistor 116 and the current source 118 form a first emitter follower circuit, and the transistor 117 and the current source 119 form a second emitter follower circuit. An output of the first emitter follower circuit which is obtained from the emitter of the transistor 116 is fed to a circuit in the succeeding stage as an inverting output of the differential amplifier 1041a. An output of the second emitter follower circuit which is obtained from the emitter of the transistor 117 is fed to a circuit in the succeeding stage as a non-inverting output of the differential amplifier 1041a.

In the above-mentioned construction, the resistors 1141 and 1142 have the same resistance value. A local feedback function is exerted by the resistors 1141 and 1142. The amplification factor of the differential amplifier 1041 can be suitably set by selecting the resistance value.

Figure 12:
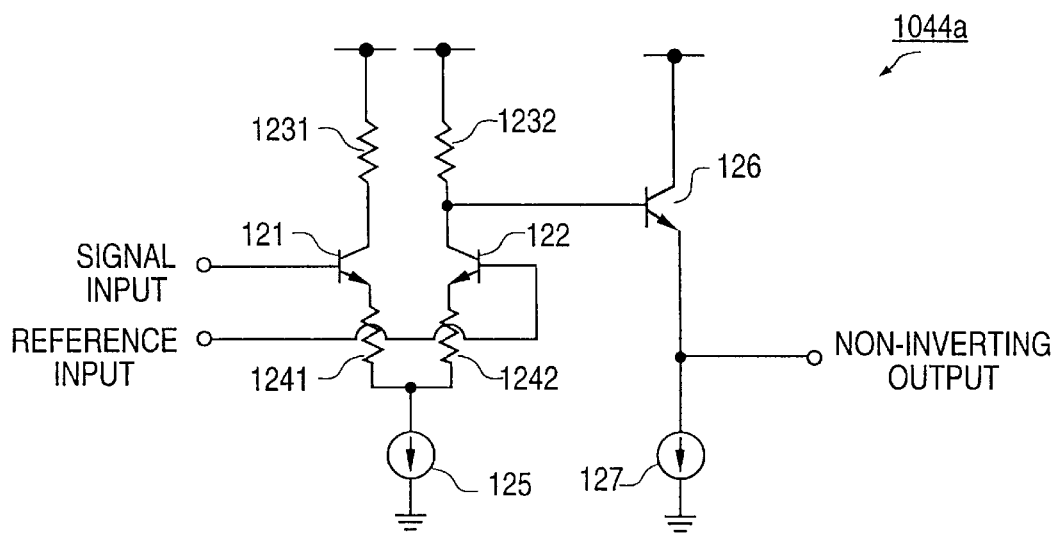
FIG. 12 is a circuit diagram showing one example of the circuit design of a differential amplifier 1044 used in the optical receiving circuit shown in FIG. 10.

FIG. 12 is a circuit diagram showing one example of the circuit design of the differential amplifier 1044a shown in FIG. 10. In advance it is pointed out that the differential amplifier 1044b also has the same circuit design as that of the differential amplifier 1044a. In FIG. 12, a transistor 121 has its collector connected to a power supply line through a resistor 1231. A transistor 122 has its collector connected to the power supply line through a resistor 1232. The transistor 121 has its emitter connected to a current source 125 through a resistor 1241. The transistor 122 has its emitter connected to the current source 125 through a resistor 1242. The output of the maximum value holding circuit 1042a is fed as a signal input to the base of the transistor 121. The output of the maximum value holding circuit 1043a is fed as a reference input to the base of the transistor 122.

A collector output of the transistor 122 is fed to the base of a transistor 126. The transistor 126 has its collector connected to the power supply line, and has its emitter connected to a current source 127. The transistor 126 and the current source 127 form an emitter follower circuit. An output of the emitter follower circuit which is obtained from the emitter of the transistor 126 is fed to a circuit in the succeeding stage as a non-inverting output of the differential amplifier 1044a.

In the above-mentioned construction, the resistors 1241 and 1242 respectively have the same resistance values as those of the resistors 1231 and 1232. A local feedback function is exerted on the resistors 1241 and 1242. When the value of the transconductance of the transistors 121 and 122 are sufficiently large, therefore, the amplification factor of the differential amplifier 1044a becomes 0.5. The same may be said of the differential amplifier 1044b.

Furthermore, in the above-mentioned construction, the current source 115 in the differential amplifier 1041a and the current source 125 in the differential amplifier 1044a are so designed that they have the same structure and the values of currents respectively flowing therethrough are the same. Further, the resistors 1131 and 1132 respectively have the same resistance values as those of the resistors 1231 and 1232. The current sources 118 and 119 which are applied to the emitter follower in the differential amplifier 1041a and the current source 127 which is applied to the emitter follower in the differential amplifier 1044a are so designed that they have the same structure and the values of currents respectively flowing therethrough are the same. In the differential amplifiers 1041a and 1044a, therefore, their respective offset voltages which are output levels in a case where there is no input become equal. Further, even when there are a power supply voltage variation and a temperature variation, variations in the offset voltages can be made equal.

Figure 13:
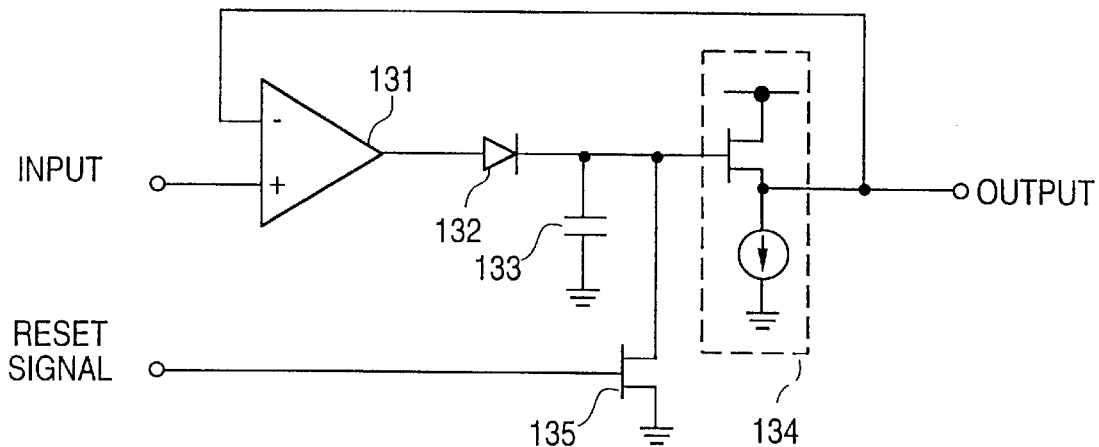
FIG. 13 is a circuit diagram showing one example of the circuit design of a maximum value holding circuit 1042a (or 1042b, 1043a, 1043b) used in the optical receiving circuit shown in FIG. 10.

FIG. 13 is a diagram showing the more detailed circuit design of the maximum value holding circuit 1042 (or 1043) shown in FIG. 10. In FIG. 13, the maximum value holding circuit 1042 (or 1043) comprises an operational amplifier 131, a diode 132 receiving an output of the operational amplifier 131, a capacitor 133 storing charge for holding a peak value, a buffer circuit 134 composed of a source follower and the like, and a switch circuit 135 turned on in response to a reset signal and forming a discharge path of the capacitor 133.

Figure 14:
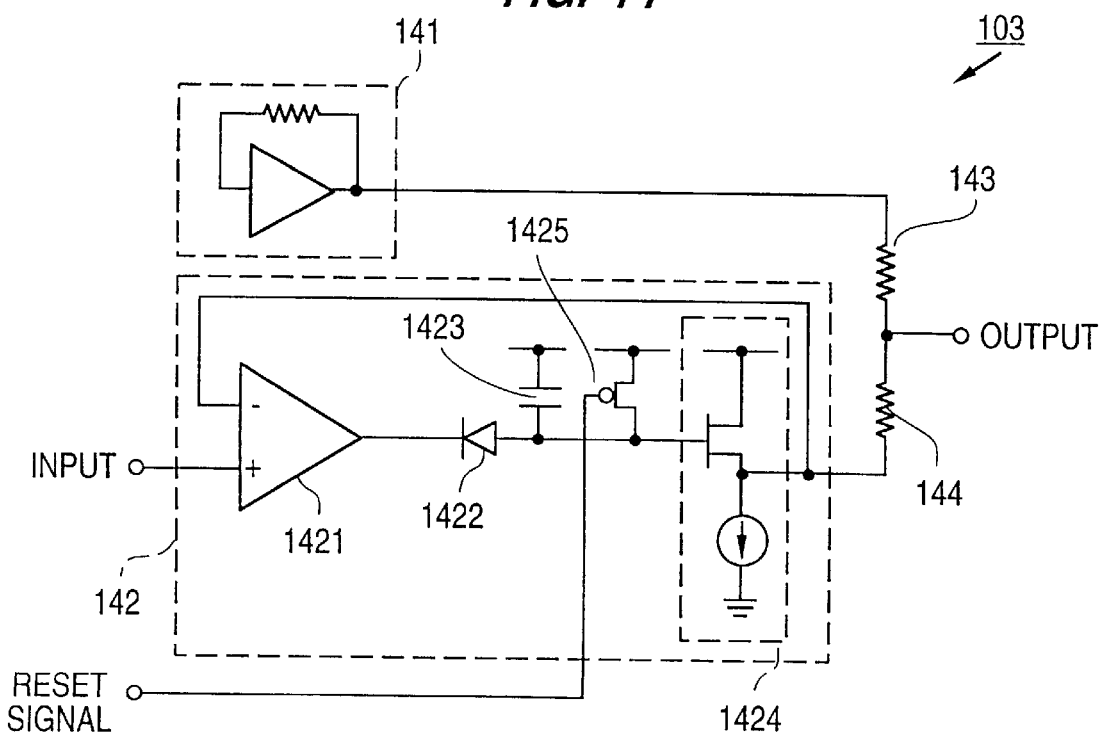
FIG. 14 is a circuit diagram showing one example of the circuit design of a reference voltage generating unit 103 used in the optical receiving circuit shown in FIG. 10.

FIG. 14 is a diagram showing the more detailed circuit design of the reference voltage generating unit 103 shown in FIG. 10. In FIG. 14, a constant-voltage output unit 141 has the same structure as those of the preamplifier 101 and the feedback resistor 102 shown in FIG. 10, and outputs a constant voltage equal to an output in a case where there is no input of the preamplifier 101. When a light signal is inputted, an output of the preamplifier 101 changes in such a direction as to decrease from an output level in a case where there is no input. The output of the constant-voltage output unit 141 is equal to the output in a case where there is no input of the preamplifier 101, whereby the maximum value of the output of the preamplifier 101 is outputted from the constant-voltage output unit 141.

A minimum value holding circuit unit 142 detects and holds the minimum value of an input signal. The minimum value holding circuit unit 142 comprises an operational amplifier 1421, a diode 1422 having its cathode connected to an output of the operational amplifier 1421, a capacitor 1423 storing charge for holding the minimum value, a buffer circuit 1424 composed of a source follower and the like, and a switch circuit 1425 turned on in response to a reset signal and forming a discharge path of the capacitor 1423.

The output of the constant-voltage output unit 141 is fed to one end of a resistor 143, and an output of the minimum value holding circuit unit 142 is fed to one end of a resistor 144. The resistors 143 and 144 have the same resistance value. The respective other ends of the resistors 143 and 144 are connected to each other, and an output of the reference voltage generating unit 103 is obtained from the connection. By such construction, a predetermined voltage value having a level in the center of the amplitude of an output signal of the preamplifier 102 is outputted from the reference voltage generating unit 103.

Figure 15:
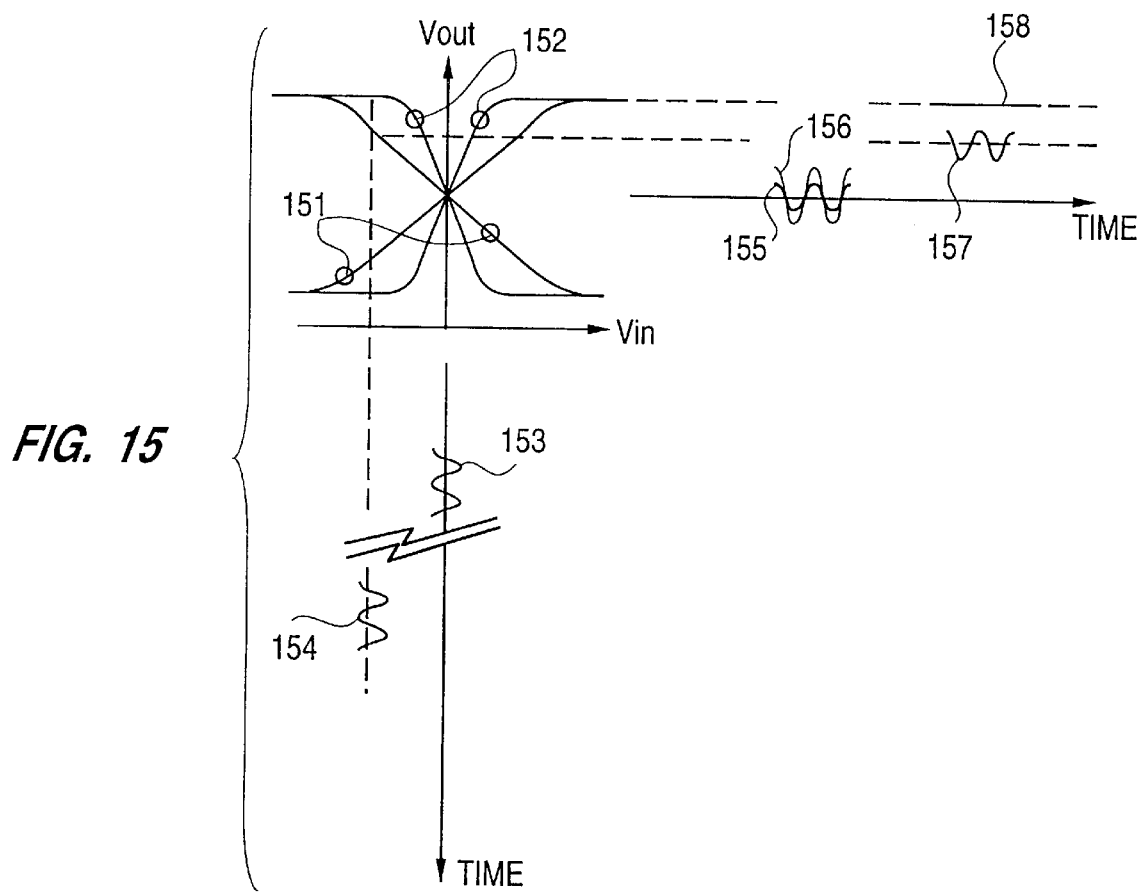
FIG. 15 is a diagram showing the relationship between an input and an output of the differential amplifier 1041 used in the optical receiving circuit shown in FIG. 10.

FIG. 15 is a diagram showing the relationship between an input signal and an output signal of the differential amplifier 1041*a* in the first amplifier unit 104*a* shown in FIG. 10 over input-output characteristics.

In FIG. 15, as the input-output characteristics, the horizontal axis represents an input voltage of a signal input against the level of an input voltage of a reference input, and the vertical axis represents the respective values of a non-inverting output and an inverting output against an input. Characteristics 151 in a case where the amplification factor of the differential amplifier 1041*a* is set to a relatively low value and characteristics 152 in a case where the amplification factor is set to a high value are entered as two input-output characteristics.

Furthermore, an input signal waveform corresponding to the time base is entered in FIG. 15. That is, an input waveform 153 in a case where the reference input is accurately set in the center of the signal waveform and an input waveform 154 in a case where the signal waveform is applied upon deviating from the reference input subsequently thereto are together entered.

An inverting output waveform in the case of the input waveform 153 is a waveform 155 when the amplification factor is set to a low value, while being a waveform 156 when the amplification factor is set to a high value. Further, an inverting output waveform in the case of the input waveform 154 is a waveform 157 when the amplification factor is set to a low value, while being a waveform 158 when the amplification factor is set to a high value. As can be seen from FIG. 15, in a case where the amplification factor is high, it would be posed the risk that an output signal may not be obtained even when the signal input slightly deviates from the reference input. The same may be said of the differential amplifier 1041*b* in the second amplifier unit 104*b*.

Figure 16:
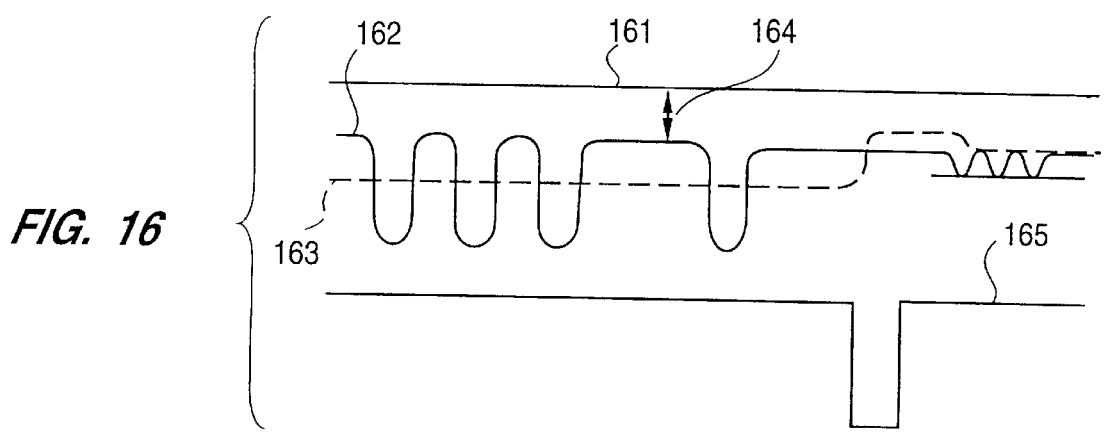
FIG. 16 is a diagram showing an example of an operation waveform of the optical receiving circuit shown in FIG. 10.

FIG. 16 is a diagram showing a waveform 162 of an output signal of the preamplifier 101 in a case where there exists background light at a DC level, an output 161 of the constant-voltage output unit 141, and an output level 163 of the reference voltage generating unit 103.

In FIG. 16, a difference 164 between the output level 161 of the constant voltage output unit 141 and the base level of the output of the preamplifier 101 (an output level in a period during which there is no light signal) is due to the background light. Further, a reset signal is indicated as a signal 165.

Description is now made of operations performed by the optical receiving circuit according to the third embodiment refering to FIG. 10 to FIG. 16.

As described in the foregoing, in an optical communication system of passive double star construction or the like in which a plurality of terminals are connected to a star coupler, even when the terminals are temporally separated to make signal transmission utilizing a TDMA technique, the light emission levels at the time of no signal transmission at each terminal may, in some cases, be added to become a level which cannot be ignored with respect to a signal level. Further, when a system that different signals are transmitted in a multi-wavelength utilizing a WDM technique is employed, it is considered that a light signal having an unnecessary wavelength is received by a photodetector as background light if the isolation of wavelength division multiplexing light is insufficient in an optical module.

A case where there is background light will be described below. A current signal obtained by converting a light signal in the photodetector 51 is converted into a voltage signal by the preamplifier. In its signal waveform, the voltage difference 164 between the level of the output signal in a period during which no light signal is received as indicated as the waveform 162 and the level of output 161 of the constant-voltage output unit 141 arises. In the minimum value holding circuit 142, the minimum value of the signal 162 is detected and held, and a value which is just intermediate between the output of the minimum value holding circuit 142 and the output of the constant-voltage output unit 141 is generated as the output 163 of the reference voltage generating unit 103 by the resistors 143 and 144.

The reset signal 165 is fed to the reference voltage generating unit 103 every time the receiving of the burst signal is terminated. When the reset signal 165 is fed, the output of the minimum value holding circuit 142 converges on the output level 162 of the preamplifier 101. On the other hand, the output of the constant-voltage output unit 141 is at a level indicated as the waveform 161, whereby the output of the reference voltage generating unit 103 enters a level in the middle of the voltage difference 164.

When the light signal is inputted, the output of the reference voltage generating unit 103 varies with the input signal. However, the output is not accurately set in the center of the signal waveform due to the effect of the background light but deviates therefrom. In this case, particularly when the input signal is small, the reference input level relatively deviates greatly from the signal level.

But, the amplification factor of the differential amplifier 1041*a* in the first amplifier unit 104*a* is set to a low value, and its linear amplification region is made sufficiently wide. Even when the signal level deviates slightly from the reference input level, as represented by the signal waveform 154, for example, therefore, it is possible to take out the signal as the output of the differential amplifier 1041*a*. In this case, it is premised that the operation characteristics of the differential amplifier 1041*a* are characteristics represented as the waveform 151.

If the signal can be taken out as the output of the differential amplifier 1041*a*, it is possible to suitably produce the signal level and the reference level in the first amplifier unit 104*a* by the same function as that described in the first embodiment. Consequently, the amplification factor can be set to a relatively high value in the second amplifier unit 104*b*. Therefore, the signal amplification in the second stage and the succeeding stages is accurately provided, so that it is possible to reproduce a pulse signal.

In the system according to the third embodiment, even when the level of the background light in each burst period differs for reasons such as the reason that the extinction ratios at the respective terminals differ from each other, it is possible to produce the reference level corresponding to the signal level at high speed if the response speed of the minimum value holding circuit 142 is sufficiently high. Even when the level of the background light varies, therefore, it is possible to reproduce the signal, from the lead of the burst signal.

Furthermore, when there are a temperature variation and a power supply voltage variation, the constant-voltage output unit 141 has the same structure as that of the preamplifier 101. Therefore, the variation in the output of the constant voltage output unit 141 has the same tendency as that of the preamplifier 101. However, it is generally difficult to make the variation characteristics of the minimum value holding circuit 142 equal to the variation characteristics of the preamplifier 101. Therefore, the output of the reference voltage generating unit 103 varies with the output signal level of the preamplifier 101.

Even if the signal input level deviates slightly from the reference input level in the input of the first amplifier 104a, however, the differential amplifier 1041a can provide a signal output so long as the linear amplification region of the differential amplifier 1041a is made sufficiently wide with respect to the deviation. Inside of the first amplifier 104a, an output of the differential amplifier 1044a is stably set in the center of the non-inverting output signal of the differential amplifier 1041a even at the time of the temperature variation and the power supply voltage variation by the same function as that described in the first embodiment.

In the first amplifier unit 104a, it is thus possible to accurately transmit a signal to the succeeding stage. Digital data can be reproduced in the comparator 105 by sufficiently amplifying the transmitted signal in the second amplifier unit 104b in the succeeding stage.

Inside of the comparator 105, the reference input is set upon deviating by an offset voltage exceeding a noise component superimposed on the signal. Consequently, noise is not amplified in the comparator 105 even in a case where there is no input. Only when the burst signal is inputted, therefore, the pulse signal can be reproduced.

By constructing the first and second amplifier units 104a and 104b as illustrated, the variations can be canceled with respect to the temperature variation and the power supply voltage variation, as described in the first embodiment. Even when the background light exists, and the temperature variation and the power supply voltage variation exist, it is found that the optical receiving circuit as shown can accurately reproduce the signal.

Although in the above-mentioned first to third embodiments, the two maximum value holding circuits are used as the peak value holding circuits, it is also possible to construct the amplifier and the optical receiving circuit according to the present invention using two minimum value holding circuits in place of the maximum value holding circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier for amplifying an inputted burst signal, said amplifier comprising:
   a first amplifier circuit for amplifying the burst signal and outputting a result of the amplification in a form of a differential output including first and second outputs appearing so as to be longitudinally symmetrical with respect to an offset voltage which is its output voltage in a case where there is no input;
   a first peak value holding circuit for detecting and holding a peak value of the first output of said first amplifier circuit;
   a second peak value holding circuit for detecting and holding a peak value of the second output of said first amplifier circuit (a peak value in a same direction as the peak value detected by said first peak value holding circuit); and
   a second amplifier circuit for differentially amplifying outputs of said first and second peak value holding circuits to generate a reference voltage following a DC level of the first output of said first amplifier circuit.

2. The amplifier according to claim 1, wherein
   an amplification factor of said second amplifier circuit is set in a vicinity of 0.5; and
   an offset voltage which is an output voltage in a case where there is no differential input of said second amplifier circuit is set so as to be approximately equal to the offset voltage of said first amplifier circuit.

3. The amplifier according to claim 2, wherein respective circuit designs and circuit constants of said first and second amplifier circuits are related to each other such that output variations caused by respective internal circuits are equal to each other.

4. The amplifier according to claim 3, wherein said first and second peak value holding circuits have same circuit designs.

5. The amplifier according to claim 4, wherein said first and second peak value holding circuits respectively comprise first and second maximum value holding circuits for detecting and holding the maximum values of the first and second outputs of said first amplifier circuit.

6. The amplifier according to claim 3, wherein said first amplifier circuit comprises:
   first and second transistors having their respective emitters connected together;
   a first current source connected to the emitters together connected of said first and second transistors;
   a first resistor interposed between the collector of said first transistor and a power supply line; and
   a second resistor interposed between the collector of said second transistor and the power supply line; and
   said second amplifier circuit comprises:
   third and fourth transistors;
   a third resistor having its one end connected to the emitter of said third transistor;
   a fourth resistor interposed between the collector of said third transistor and the power supply line and having a same resistance value as that of said first resistor;
   a fifth resistor having its one end connected to the emitter of said fourth transistor and having a same resistance value as that of said third resistor;
   a sixth resistor interposed between the collector of said fourth transistor and the power supply line and having a same resistance value as that of said second resistor; and
   a second current source connected to the respective other ends of said third and fifth resistors, having a same structure as that of said first current source, and a current flowing therethrough being a same value as a current flowing through said first current source.

7. The amplifier according to claim 1, wherein said first amplifier circuit comprises a differential amplifier receiving the burst signal as a signal input, receiving a fixed voltage temporarily set with respect to a DC level of the burst signal as a reference input, and differentially amplifying the burst signal on the basis of the fixed voltage.

8. The amplifier according to claim 1, further comprising a third amplifier circuit receiving the first output of said first amplifier circuit as a signal input, receiving the reference voltage outputted from said second amplifier circuit as a reference input, and differentially amplifying the first output on the basis of the reference voltage.

9. The amplifier according to claim 1, further comprising a comparator receiving the first output of said first amplifier circuit as a signal input, receiving the reference voltage outputted from said second amplifier circuit as a reference input, and discriminating the first output with the reference voltage taken as a threshold value, to shape the output of the first amplifier circuit into a digital waveform.

10. An optical receiving circuit for receiving an optical burst signal and amplifying the received optical burst signal, said optical receiving circuit comprising:
    a photodetector for converting the received optical burst signal into a current signal;
    a first amplifier circuit for converting the current signal from said photodetector into a voltage signal and amplifying the voltage signal, and outputting a result of the amplification in a form of a differential output including first and second outputs appearing so as to be longitudinally symmetrical with respect to an offset voltage which is its output voltage in a case where there is no input;
    a first peak value holding circuit for detecting and holding a peak value of the first output of said first amplifier circuit;
    a second peak value holding circuit for detecting and holding a peak value of the second output of said first amplifier circuit (a peak value in a same direction as the peak value detected by said first peak value holding circuit); and
    a second amplifier circuit for differentially amplifying outputs of said first and second peak value holding circuits to generate a reference voltage following a DC level of the first output of said first amplifier circuit.

11. The optical receiving circuit according to claim 10, wherein
    an amplification factor of said second amplifier circuit is set in a vicinity of 0.5; and
    an offset voltage which is an output voltage in a case where there is no differential input of said second amplifier circuit is set so as to be approximately equal to the offset voltage of said first amplifier circuit.

12. The optical receiving circuit according to claim 11, wherein respective circuit designs and circuit constants of said first and second amplifier circuits are related to each other such that output variations caused by respective internal circuits are equal to each other.

13. The optical receiving circuit according to claim 12, wherein
    said first and second peak value holding circuits have same circuit designs.

14. The optical receiving circuit according to claim 13, wherein
    said first and second peak value holding circuits respectively comprise first and second maximum value holding circuits for detecting and holding the maximum values of the first and second outputs of said first amplifier.

15. The optical receiving circuit according to claim 12, wherein
    said first amplifier circuit comprises a first differential amplifier, first and second emitter followers, and first and second feedback resistors;
    said first differential amplifier comprising:
        first and second transistors having their respective emitters connected together;
        a first current source connected to the emitters together connected of said first and second transistors;
        a first resistor interposed between the collector of said first transistor and a power supply line; and
        a second resistor interposed between the collector of said second transistor and the power supply line;
        a current signal outputted from said photodetector being fed to a base of said first transistor;
        an inverting output of said first differential amplifier which is obtained from the collector of said first transistor being outputted through said first emitter follower;
        a non-inverting output of said first differential amplifier which is obtained from the collector of said second transistor being outputted through said second emitter follower;
        an output of said first emitter follower being fed back to the base of said first transistor through said first feedback resistor; and
        an output of said second emitter follower being fed back to a base of said second transistor through said second feedback resistor; and
    said second amplifier circuit comprises:
        a third transistor having its base receiving the output of said first peak value holding circuit;
        a fourth transistor having its base receiving the output of said second peak value holding circuit;
        a third resistor interposed between a collector of said third transistor and the power supply line and having a same resistance value as that of said first resistor;
        a fourth resistor interposed between a collector of said fourth transistor and the power supply line and having a same resistance value as that of said second resistor;
        a fifth resistor having its one end connected to an emitter of said third transistor;
        a sixth resistor having its one end connected to an emitter of said fourth transistor;
        a second current source connected to the respective other ends of said fifth and sixth resistors, having a same structure as that of said first current source, and a current flowing therethrough being a same value as a current flowing through said first current source; and
        a third emitter follower having a same structure as those of said first and second emitter followers and receiving a signal outputted from a collector of said fourth transistor.

16. The optical receiving circuit according to claim 10, wherein
    a reset signal is fed to said first and second maximum value holding circuits every time receiving of the optical burst signal is terminated; and
    respective output voltages of said first and second maximum value holding circuits are set so as to be approximately equal to the offset voltage of said first amplifier circuit in response to said reset signal.

17. The optical receiving circuit according to claim 10, further comprising
    a third amplifier circuit receiving the first output of said first amplifier circuit as a signal input, receiving the reference voltage outputted from said second amplifier circuit as a reference input, and differentially amplifying the first output on the basis of the reference voltage.

18. The optical receiving circuit according to claim 17, further comprising
    a comparator for discriminating an output of said third amplifier circuit with a level of the reference input taken as a threshold value, to shape the output of the third amplifier circuit into a digital waveform;

wherein the level of the reference input of said comparator being set to a level which is a sum of the level of the output of said third amplifier in a case where no optical burst signal is inputted and an offset corresponding to noise amplitude.

19. The optical receiving circuit according to claim 10, further comprising a comparator receiving the first output of said first amplifier circuit as a signal input, receiving the reference voltage outputted from said second amplifier circuit as a reference input, and discriminating the first output with the reference voltage taken as a threshold value, to shape the output of the first amplifier circuit into a digital waveform.

20. An optical receiving circuit for receiving an optical burst signal and amplifying the received optical burst signal, said optical receiving circuit comprising:

a photodetector for converting the received optical burst signal into a current signal;

a preamplifier circuit for converting the current signal from said photodetector into a voltage signal and amplifying the voltage signal;

a reference voltage generating circuit for generating a reference voltage; and a main amplifier circuit for amplifying an output of said preamplifier circuit;

said main amplifier circuit comprising:

a first amplifier circuit receiving the output of said preamplifier circuit as a signal input, receiving an output of said reference voltage generating circuit as a reference input, differentially amplifying the signal input on a basis of the reference input, and outputting a result of the amplification in a form of a differential output including first and second outputs appearing so as to be longitudinally symmetrical with respect to an offset voltage which is its output voltage in a case where there is no input;

a first peak value holding circuit for detecting and holding a peak value of the first output of said first amplifier circuit;

a second peak value holding circuit for detecting and holding a peak value of the second output of said first amplifier circuit (a peak value in a same direction as the peak value detected by said first peak value holding circuit); and a second amplifier circuit for differentially amplifying outputs of said first and second peak value holding circuits to generate a reference voltage following a DC level of the first output of said first amplifier circuit.

21. The optical receiving circuit according to claim 20, wherein an amplification factor of said second amplifier circuit is set in a vicinity of 0.5; and an offset voltage which is an output voltage in a case where there is no differential input of said second amplifier circuit is set so as to be approximately equal to the offset voltage of said first amplifier circuit.

22. The optical receiving circuit according to claim 21, wherein respective circuit designs and circuit constants of said first and second amplifier circuits are related to each other such that output variations caused by respective internal circuits are equal to each other.

23. The optical receiving circuit according to claim 22, wherein said first and second peak value holding circuits have same circuit designs.

24. The optical receiving circuit according to claim 23, wherein said first and second peak value holding circuits respectively comprise first and second maximum value holding circuits for detecting and holding the maximum values of the first and second outputs of said first amplifier circuit.

25. The optical receiving circuit according to claim 24, wherein said reference voltage generating circuit is constituted by a fixed voltage power supply.

26. The optical receiving circuit according to claim 24, wherein said reference voltage generating circuit detects the maximum value and the minimum value of an output signal from said preamplifier circuit, and outputs a value intermediate therebetween.

27. The optical receiving circuit according to claim 22, wherein said first amplifier circuit comprises:

a first transistor having its base receiving the output of said preamplifier circuit;

a second transistor having its base receiving the output of said reference voltage generating circuit;

a first resistor interposed between a collector of said first transistor and a power supply line;

a second resistor interposed between a collector of said second transistor and the power supply line;

a first current source;

a third resistor interposed between an emitter of said first transistor and said first current source; and a fourth resistor interposed between an emitter of said second transistor and said first current source and having a same resistance value as that of said third resistor, and said second amplifier circuit comprises:

a third transistor having its base receiving the output of said first peak value holding circuit;

a fourth transistor having its base receiving the output of said second peak value holding circuit;

a fifth resistor interposed between a collector of said third transistor and the power supply line, and having a same resistance value as that of said second resistor;

a sixth resistor interposed between a collector of said fourth transistor and the power supply line, and having a same resistance value as that of said second resistor;

a second current source having a same structure as that of said first current source, and a current flowing therethrough being a same value as a current flowing through said first current source;

a seventh resistor interposed between an emitter of said third transistor and said second current sources and having the same resistance value as that of said fifth resistor; and an eighth resistor interposed between an emitter of said fourth transistor and said second current sources and having a same resistance value as that of said sixth resistor.

28. The optical receiving circuit according to claim 20, wherein a reset signal is fed to said first and second maximum value holding circuits every time a receiving of the optical burst signal is terminated; and respective output voltages of said first and second maximum value holding circuits are set so as to be approximately equal to the offset voltage of said first amplifier circuit in response to said reset signal.

29. The optical receiving circuit according to claim 20, wherein said main amplifier circuit is of multi-stage construction such that a plurality of amplifier units each comprising said first and second amplifier circuits and said first and second peak value holding circuits are connected in cascade; and said first amplifier circuit in the amplifier unit in each of the second stage and the succeeding stages receives as a signal input the first output of said first amplifier circuit in the amplifier unit in the preceding stage, and receives as a reference input the output of said second amplifier circuit in the amplifier unit in the preceding stage.

30. The optical receiving circuit according to claim 29, wherein an amplification factor of the amplifier unit in the first stage in said main amplifier circuit is set so as to be lower than amplification factors of the amplifier units in the second stage and the succeeding stages.

31. The optical receiving circuit according to claim 30, further comprising a comparator receiving as a signal input the first output of said first amplifier circuit in the amplifier unit in the final stage in said main amplifier circuit, receiving as a reference input the reference voltage outputted from said second amplifier circuit, and discriminating the first output with the reference voltage taken as a threshold value, to shape the output of the first amplifier circuit into a digital waveform.

32. The optical receiving circuit according to claim 31, wherein the level of the reference input of said comparator is set to a level which is a sum of the level of the output of said second amplifier circuit in the amplifier unit in the final stage in a case where no optical burst signal is inputted and an offset corresponding to noise amplitude.

\* \* \* \* \*